(12) United States Patent
Ito et al.

(10) Patent No.: US 7,093,143 B2
(45) Date of Patent: Aug. 15, 2006

(54) SEMICONDUCTOR INTEGRATED CIRCUIT

(75) Inventors: Takayasu Ito, Higashimurayama (JP); Mitsuru Hiraki, Kodaira (JP); Yuichi Okuda, Higashimurayama (JP)

(73) Assignee: Renesas Technology Corp., Tokyo (JP)

( * ) Notice: Subject to any disclaimer, the term of this patent is extended or adjusted under 35 U.S.C. 154(b) by 411 days.

(21) Appl. No.: 10/423,882

(22) Filed: Apr. 28, 2003

(65) Prior Publication Data

US 2003/0212916 A1 Nov. 13, 2003

(30) Foreign Application Priority Data

May 10, 2002 (JP) .............................. 2002-135189

(51) Int. Cl.
*G06F 1/26* (2006.01)
(52) U.S. Cl. .......................... 713/300; 323/284; 361/90
(58) Field of Classification Search ................ 323/284; 361/90; 713/300
See application file for complete search history.

(56) References Cited

U.S. PATENT DOCUMENTS

| | | | |
|---|---|---|---|
| 5,224,010 A * | 6/1993 | Tran et al. ..................... | 361/90 |
| 5,905,370 A * | 5/1999 | Bryson ........................ | 323/283 |
| 6,792,489 B1 * | 9/2004 | Osburn et al. .............. | 710/104 |

FOREIGN PATENT DOCUMENTS

JP  7-287699  10/1995

OTHER PUBLICATIONS

Analog Devices, "ADP3421: Geyserville-Enabled DC—DC Converter Controller for Mobile CPUs", Rev. 0, Oct. 1999.*
Thomas Burd et al., "A Dynamic Voltage-Scaled Microprocessor System", *ISSCC 2000 Slide Supplement*, Feb. 2000, pp. 232-233.

* cited by examiner

*Primary Examiner*—Thomas Lee
*Assistant Examiner*—Albert Wang
(74) *Attorney, Agent, or Firm*—Miles & Stockbridge P.C.

(57) ABSTRACT

There is provided a semiconductor integrated circuit that hardly causes an unnecessary operation time for variable control over an operating frequency and an internal power supply voltage. A CPU specifies an operational clock signal frequency to a clock generation circuit and an internal power supply voltage to a power supply circuit. The power supply circuit comprises a voltage regulator and a determination circuit to determine a transition state to a specified internal power supply voltage. The CPU uses a first signal to notify which time point the power supply voltage variable control start to the power supply circuit. The power supply circuit returns a second signal to the CPU to notify at which time point the power supply voltage variable control terminated. Based on handshaking between the first and second signals, the power supply voltage variable control hardly causes an unnecessary operation time for variable control over the operating frequency and the internal power supply voltage for saving power consumptions.

22 Claims, 26 Drawing Sheets

| n=2 | | SETTING VOLTAGE(V) | DETERMINATION VOLTAGE (V) | |
|---|---|---|---|---|
| | | Vset | Vset+ΔV | Vset−ΔV |
| INTERNAL POWER SUPPLY VOLTAGE (Vint) SETTING LEVEL | V0 | 0.90 | 0.95 | 0.85 |
| | V1 | 1.00 | 1.05 | 0.95 |
| | V2 | 1.10 | 1.15 | 1.05 |
| | V3 | 1.20 | 1.25 | 1.15 |

FIG. 10
| ck | rset | q |
|---|---|---|
| H | | HOLDING PREVIOUS STATUS |
| L | H | |
| ↓ | | |
| ↑ | H | H |
| X | L | L |
FIG. 11
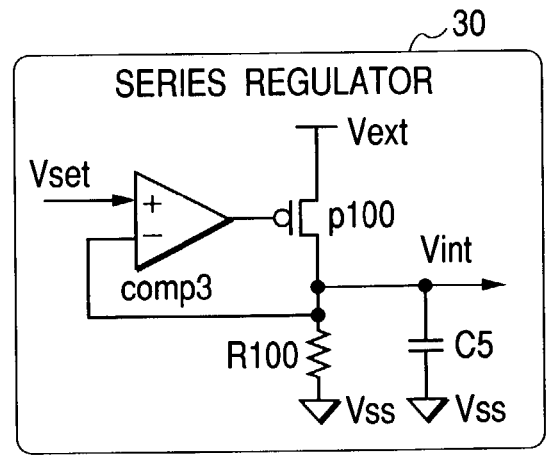
FIG. 12
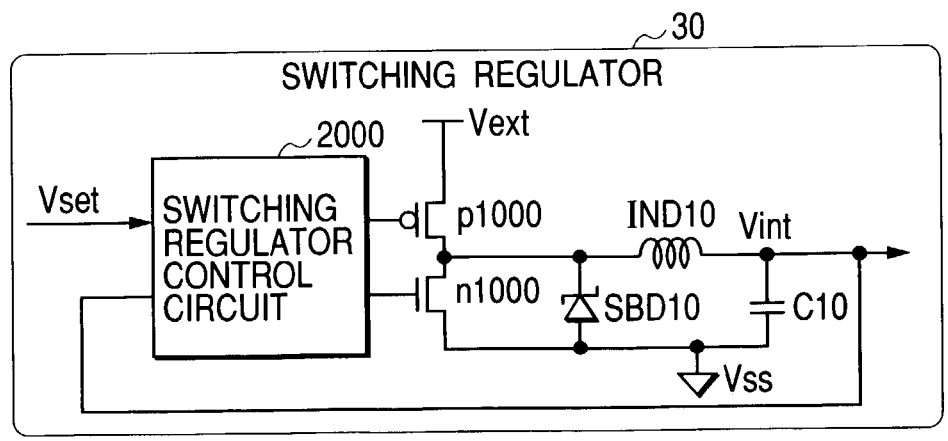

FIG. 20

| n=2 | | SETTING VOLTAGE (V) | OVERDRIVE VOLTAGE (V) | |
|---|---|---|---|---|
| | | Vset | Vsetov (CHANGING SETTING LEVEL FROM LOWER VOLTAGE TO HIGHER VOLTAGE) | Vsetov (CHANGING SETTING LEVEL FROM HIGHER VOLTAGE TO LOWER VOLTAGE) |
| INTERNAL POWER SUPPLY VOLTAGE (Vint) SETTING LEVEL | V0 | 0.90 | – | 0.85 |
| | V1 | 1.00 | 1.05 | 0.95 |
| | V2 | 1.10 | 1.15 | 1.05 |
| | V3 | 1.20 | 1.25 | – |

FIG. 26

| na=2<br>nb=2 | | SETTING<br>VOLTAGE A (V) | DETERMINATION<br>VOLTAGE A (V) | | SETTING<br>VOLTAGE B (V) | DETERMINATION<br>VOLTAGE B (V) | |
|---|---|---|---|---|---|---|---|
| | | Vseta | Vseta+ΔV | Vseta−ΔV | Vsetb | Vsetb+ΔV | Vsetb−ΔV |
| INTERNAL POWER SUPPLY VOLTAGE (Vint) SETTING LEVEL | V0 | 0.90 | 0.95 | 0.85 | 1.20 | 1.25 | 1.15 |
| | V1 | 1.00 | 1.05 | 0.95 | 1.30 | 1.35 | 1.25 |
| | V2 | 1.10 | 1.15 | 1.05 | 1.40 | 1.45 | 1.35 |
| | V3 | 1.20 | 1.25 | 1.15 | 1.50 | 1.55 | 1.45 |

SEMICONDUCTOR INTEGRATED CIRCUIT

BACKGROUND OF THE INVENTION

The present invention relates to a power supply circuit to generate an internal power supply voltage from an external power supply voltage, a semiconductor integrated circuit having such on-chip mounted power supply circuit, and an information recording medium to record design data for providing the power supply circuit as a design part in a computer-readable format. For example, the present invention relates to a technology efficiently applied to variably control the internal power supply voltage in response to an operating frequency of the CPU in order to save power consumption of the semiconductor integrated circuit.

When a semiconductor integrated circuit contains a CPU that operates on an internal power supply voltage lower than a power voltage used for an interface between chips, there is known a method of variably controlling the internal power supply voltage in accordance with an operating frequency of the CPU to save power consumption of the semiconductor integrated circuit. Generally, however, an upper bound is placed on the frequency that can operate on the internal power supply voltage supplied to the CPU. The CPU may malfunction if the internal power supply voltage is decreased with a high frequency applied to the CPU. On the other hand, when the CPU operates at a low frequency, it may need to be operated at a high operating frequency by increasing the internal power supply voltage. In such case, there is a problem of when to supply a high frequency to the CPU. Conventionally, there is known a method of using a timer circuit to determine a specified period to be a voltage transition period from the time to start voltage variable control. During this period, the CPU's operating frequency is decreased or the CPU is stopped. After the voltage transition period, an intended operating frequency is supplied to the CPU. According to another prior art, a CPU's replica circuit is created on the same chip and is supplied with an operational clock. An error detection circuit always monitors an operational delay in the CPU replica circuit and selects an internal power supply voltage that does not cause the CPU to malfunction. When the operating frequency is changed, the internal power supply voltage varies with the operating frequency. This is the same as the voltage variable control. The former prior art is exemplified in Japanese Unexamined Patent Publication No. Hei 7 (1995)-287699. The latter prior art is exemplified in "A Dynamic Voltage Scaled Microprocessor System" (Thomas B, et al., ISSCC Digest of Technical Papers, pp. 232–233, February 2000).

SUMMARY OF THE INVENTION

The inventors found the following problems in the above-mentioned prior arts. When the timer circuit specifies the voltage transition period according to the former prior art, a general practice is to set a period longer than the period needed for the internal power supply voltage to reach an intended voltage level. For this reason, a time loss is sure to occur as a difference between the voltage transition period specified by the timer and the actual voltage transition period. According to the latter prior art, the design of the CPU itself must be completed before accurately designing the CPU replica circuit, extending the design period.

It is an object of the present invention to provide a semiconductor integrated circuit that hardly causes an unnecessary operation time for variable control over the operating frequency and the internal power supply voltage for saving power consumptions and easily prevents a design period needed for the variable control from being prolonged.

It is another object of the present invention to provide a power supply circuit optimal for such semiconductor integrated circuit and the like.

It is still another object of the present invention to provide an information recording medium which records design data useful for facilitating the design of the power supply circuit and the semiconductor integrated circuit.

It is yet another object of the present invention to provide a semiconductor integrated circuit which decreases a time loss through the use of the above-mentioned timer and does not need to prolong a design period needed for designing the CPU replica circuit.

These and other objects and novel features of the invention may be readily ascertained by referring to the following description and appended drawings.

The following concisely describes outlines of representative aspects of the present invention disclosed in the application concerned.

[1] The semiconductor integrated circuit according to the present invention comprises a CPU (400), a clock generation circuit (200, 201), and a power supply circuit (500, 501, 502, 503). The clock generation circuit supplies a operational clock signal (f1, f1a, f1b) to the CPU. The CPU specifies a frequency of the operational clock signal for the clock generation circuit and an internal power supply voltage (Vint) for the power supply circuit. The power supply circuit comprises a voltage regulator (30, 30a, 30b, 31) to generate the internal power supply voltage from an external power supply voltage (Vext); and a determination circuit (40, 41, 40a, 40b) to determine a transition state to the specified internal power supply voltage. The determination circuit inputs a first signal (req0, req0a, req0b, req1*up*, req1*dwn*) output from the CPU, determines attainment to the specified internal power supply voltage, and outputs a second signal (ack0, ack0a, ack0b) to the CPU.

According to the above-mentioned means, the CPU can use a first signal to notify the on-chip power supply circuit from which time point the power supply voltage variable control started. The on-chip power supply circuit returns a second signal to the CPU to notify at which time point the power supply voltage variable control terminated. Based on handshaking of the first and second signals between the CPU and the power supply circuit, the power supply voltage variable control hardly causes an unnecessary operation time for variable control over the operating frequency and the internal power supply voltage for saving power consumptions. Further, if a replica circuit is used for the CPU, it is possible to complete the design of circuits needed for the voltage variable control without awaiting completion of the design of the CPU itself, preventing the entire design period from being prolonged.

As a mode of the voltage variable control, the CPU, when increasing an internal power supply voltage and an operational clock frequency, specifies to change the internal power supply voltage and outputs a first signal, correspondingly inputs the second signal output from the determination circuit, and then specifies to increase the operational clock signal frequency. This can prevent malfunction due to an operational clock signal frequency increased before the power supply voltage attains to a specified value.

As another mode of the voltage variable control, the CPU, when decreasing an internal power supply voltage and an operational clock frequency, decreases the operational clock frequency and then specifies to change the internal power supply voltage. This can prevent malfunction due to a decreased internal power supply voltage while the operational clock frequency remains high.

As a specific mode of the present invention, the determination circuit comprises a mask circuit (latch0, inv10, DEL, and1 and nand0) which disables a determination result of the transition state until expiration of a specified period after input of the first signal. For example, the specified period is necessary for stabilizing a change in the determination voltage as a comparison reference for the determination circuit to determine the transition state. Accordingly, the determination circuit can be free from incorrect determination even if an instruction to change the internal power supply voltage causes an unstable transition state in the transitional response from the determination voltage.

As a specific mode of the target voltage detection, the power supply circuit further comprises a voltage setting circuit which inputs a voltage setting signal from the CPU to generate a setting voltage and a determination voltage, supplies the setting voltage to the voltage regulator, and supplies the determination voltage to a determination circuit. The determination voltage comprises a first determination voltage (Vset+$\Delta$V) and a second determination voltage (Vset−$\Delta$V) each having a specified voltage tolerance ($\pm\Delta$V) toward positive and negative sides with reference to the setting voltage. The determination circuit determines attainment to the specified internal power supply voltage when the internal power supply voltage attains to a voltage between a first determination voltage and a second determination voltage. In short, the second signal is returned if a target voltage is generated within the range of $\pm\Delta$V.

The following describes a further detailed mode of this target voltage detection. When performing the variable control of an internal power supply voltage (Vint), a CPU (400) sends an n-bit voltage setting signal (vc0) to an on-chip power supply circuit (500) to change the voltage level of an internal power supply voltage (Vint). The CPU 400 sends a request signal (req0) to an on-chip power supply circuit (500) for notifying from which time point the voltage variable control started. The on-chip power supply circuit (500) returns an acknowledge signal (ack0) to the CPU (400) for notifying at which time point the voltage variable control terminated. The on-chip power supply circuit (500) contains a voltage transition period determination circuit (40) that contains two comparators (comp1 and comp2) for determining the internal power supply voltage (Vint). After the voltage transition period determination circuit (40) receives the request signal (req0), the comparators (comp1 and comp2) operate to compare the internal power supply voltage Vint with a determination voltage (Vset+$\Delta$V) slightly higher than the setting voltage Vset and a determination voltage (Vset−$\Delta$V) slightly lower than the setting voltage Vset that is supplied from the internal voltage setting circuit (20). When the relation of Vset−$\Delta$V<Vint<Vset+$\Delta$V is satisfied, an acknowledge signal (ack0) is returned.

As another specific mode of the target voltage detection, the power supply circuit further comprises a voltage setting circuit and an overdrive circuit (50). The voltage setting circuit inputs a voltage setting signal from the CPU to generate a setting voltage and supplies the setting voltage to the overdrive circuit and the determination circuit. The overdrive circuit can output the setting voltage or an overdrive setting voltage (Vsetov) exceeding the setting voltage to the voltage regulator. The determination circuit inputs the first signal, then allows an overdrive circuit to output the overdrive setting voltage, determines attainment to the specified internal power supply voltage based on the overdrive setting voltage when an output voltage (Vint) generated in a voltage regulator satisfies the setting voltage (Vset), and then allows the overdrive circuit to output the setting voltage. This overdrive method makes it possible to reliably detect a state attaining to the setting voltage as a target of the internal power supply voltage overdriven in the voltage regulator with reference to the setting voltage and to return the second signal. With respect to this point, the overdrive method can detect attainment to a target voltage more accurately than the above-mentioned method of detecting an area of $\pm\Delta$V.

In the overdrive method, for example, the first signal comprises signals (req1*up* and req1*dwn*) to independently specify a request to increase a power supply voltage and a request to decrease the same. When the first signal indicates a request to increase a power supply voltage, an output voltage generated by the voltage regulator due to the overdrive setting voltage (Vsetov) has a higher level than that of an output voltage generated by the voltage regulator due to the setting voltage (Vset). When the first signal indicates a request to decrease a power supply voltage, an output voltage generated by the voltage regulator due to the overdrive setting voltage has a lower level than that of an output voltage generated by the voltage regulator due to the setting voltage.

The semiconductor integrated circuit according to another aspect of the target voltage detection based on the overdrive method comprises a CPU, a clock generation circuit, and a power supply circuit. The clock generation circuit supplies an operational clock signal to the CPU. The CPU specifies an operational clock signal frequency for the clock generation circuit and an internal power supply voltage for the power supply circuit. The power supply circuit comprises a voltage regulator to generate the internal power supply voltage from an external power supply voltage and a determination circuit to determine a transition state to the specified internal power supply voltage. The voltage regulator can generate a voltage based on the a setting voltage generated on the basis of a voltage setting signal supplied from the CPU or based on an overdrive setting voltage exceeding the setting voltage. The determination circuit inputs a first signal output from the CPU, then allows the voltage regulator to generate a voltage based on the overdrive setting voltage, determines attainment to the specified internal power supply voltage when a generated voltage satisfies the setting voltage, outputs a second signal to the CPU, and allows the voltage regulator to generate a voltage based on the setting voltage.

[2] A power supply circuit (700, 701) according to the present invention comprises a voltage regulator (35) to generate a second power supply voltage (internal power supply voltage) from a first power supply voltage (external power supply voltage); and a determination circuit (45, 46) to determine a transition state to a specified second power supply voltage, The determination circuit inputs a first signal from the outside, determines attainment to the specified second power supply voltage, and outputs a second signal to the outside.

According to the above-mentioned means, the first signal from the outside can be used to notify the power supply circuit from which time point the power supply voltage variable control started. The second signal can be returned to the outside to notify at which time point the power supply voltage variable control terminated by the power supply circuit. This enables the power supply voltage variable control by means of handshaking of the first and second signals between the outside and the power supply circuit. Consequently, an unnecessary operation time hardly occurs during the variable control over the operating frequency and the second power supply voltage for saving power consumptions. Further, if a replica circuit is used for the CPU, it is needless to await completion of the design of the CPU itself as an external circuit.

Like the semiconductor integrated circuit, a mask circuit may be used for the determination circuit. It may be preferable to use the overdrive method or the method of detecting an area of $\pm\Delta V$ for voltage detection.

[3] The information recording medium (4) according to the present invention records design data about a power supply circuit such as the power supply circuit in a computer-readable manner. The design data specifies a voltage regulator to generate a second power supply voltage (internal power supply voltage) from a first power supply voltage (external power supply voltage); and a determination circuit to determine a transition state to a specified second power supply voltage. The determination circuit inputs a first signal from the outside, determines attainment to the specified second power supply voltage, and outputs a second signal to the outside. Logic circuit configurations are specified in the hardware description language called HDL (Hardware Description Language). Circuits are specified with pattern data for photo masks or mask pattern data for electron beam lithography. Design data specified in the former form is also referred to as soft IP (Intellectual Property) module data. Design data specified in the latter form is also referred to as hard IP module data.

Like the semiconductor integrated circuit, a mask circuit may be used for the determination circuit. It may be preferable to use the overdrive method or the method of detecting an area of $\pm\Delta V$ for voltage detection.

Since there is provided the information recording medium that stores the design data, the design data can be made available more easily than creating design data from scratch. It is possible to facilitate the design of the power supply circuit that hardly causes an unnecessary operation time for variable control over the operating frequency and the second power supply voltage for saving power consumptions. Further, it is possible to help decrease the number of processes for designing the semiconductor integrated circuit having such power supply circuit on chip.

BRIEF DESCRIPTION OF THE DRAWINGS

FIG. 10 is an explanatory diagram showing truth values concerning the function of an edge trigger latch in the semiconductor integrated circuit of FIG. 1;

FIG. 11 is a circuit diagram exemplifying a circuit configuration of a step-down regulator in the semiconductor integrated circuit of FIG. 1;

FIG. 12 is a circuit diagram showing a modification of the step-down regulator in the semiconductor integrated circuit of FIG. 1;

FIG. 20 is an explanatory diagram exemplifying relationship between a setting voltage and an overdrive voltage in the semiconductor integrated circuit of FIG. 13;

FIG. 26 is an explanatory diagram showing relationship between a setting voltage and a determination voltage in the semiconductor integrated circuit of FIG. 24;

FIG. 29 is an explanatory diagram comprehensively exemplifying a design system used for logical designs, circuit designs, layout designs, and the like of semiconductor integrated circuits and the like.

DETAILED DESCRIPTION OF THE PREFERRED EMBODIMENTS

Figure 1:
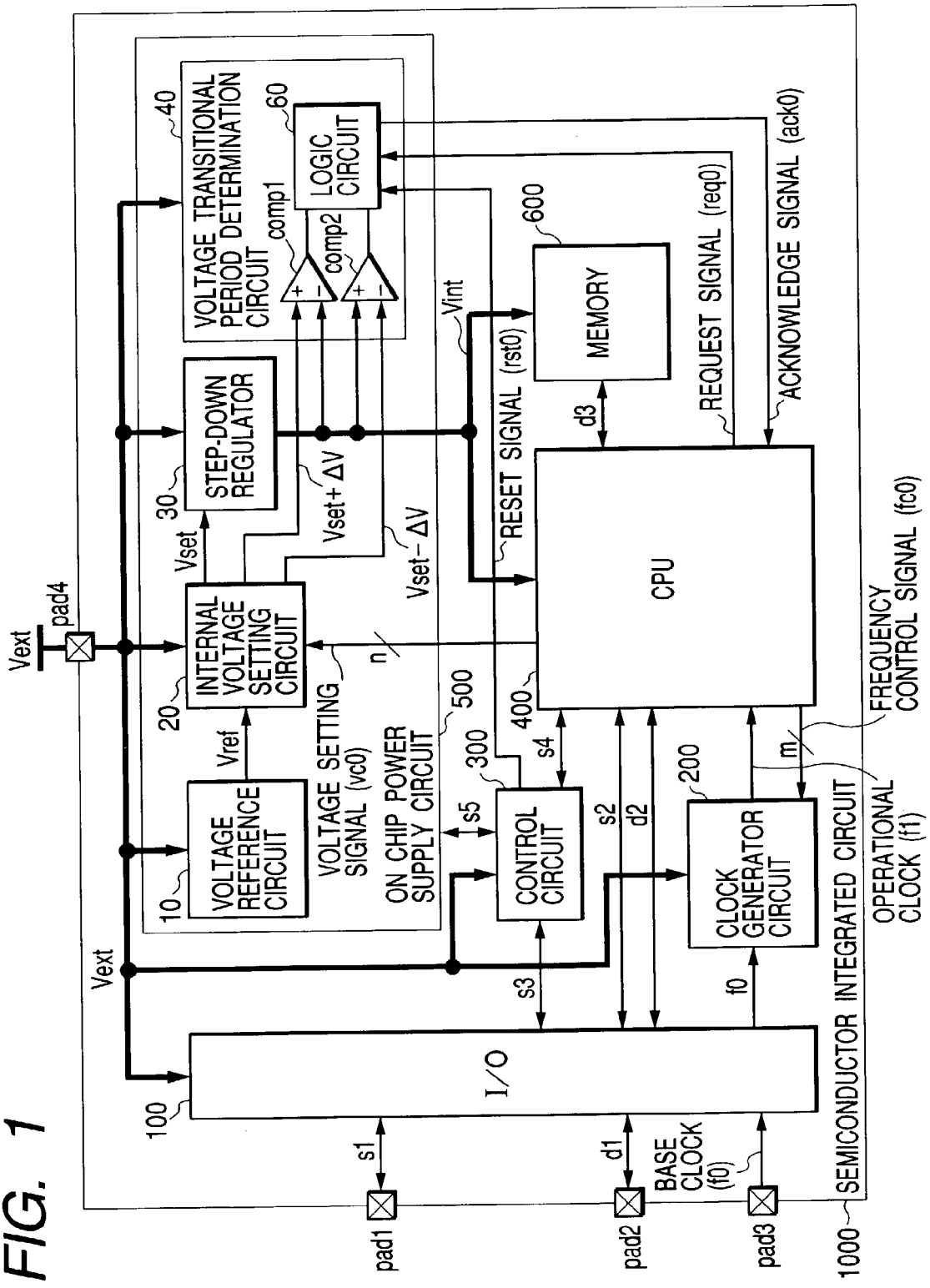
FIG. 1 is a block diagram showing a first example of a semiconductor integrated circuit according to the present invention.

FIG. 1 shows a first example of a semiconductor integrated circuit according to the present invention. In FIG. 1, a semiconductor integrated circuit 1000 comprises an input/output circuit (I/O) 100, a clock generation circuit 200, a control circuit 300, a CPU (Central Processing Unit) 400, a power supply circuit 500, and a memory 600. For example, the semiconductor integrated circuit 1000 is formed by a technology for manufacturing a CMOS integrated circuit comprising a single semiconductor substrate such as monocrystal silicon.

The CPU 400 operates in accordance with internal power supply voltage Vint generated by the on-chip power supply circuit 500 and an operating frequency of operational clock signal f1 supplied from the clock generation circuit 200. In the power supply circuit 500, the internal voltage setting circuit 20 forms setting voltage Vset dependent on n-bit voltage setting signal vc0 sent from the CPU 400 based on reference voltage Vref generated in the voltage reference circuit 10. The setting voltage Vset is supplied to a step-down voltage regulator (simply referred to as a step-down regulator) 30 that generates the internal power supply voltage Vint stepped down from power supply voltage (external power supply voltage) Vext used for an interface between chips. The voltage variable control of the internal power supply voltage Vint needs to change both the internal power supply voltage Vint and the operating frequency of the CPU 400. The internal power supply voltage Vint is changed in accordance with the n-bit voltage setting signal vc0. The operating frequency of the CPU 400 is changed in accordance with m-bit frequency control signal fc0 sent to the clock generation circuit 200 based on base clock f0.

When performing the variable control of the internal power supply voltage Vint, the CPU 400 sends request signal (first signal) req0 to an on-chip power supply circuit 500 for notifying from which time point the voltage variable control started. The on-chip power supply circuit 500 returns acknowledge signal (second signal) ack0 to the CPU 400 for notifying at which time point the voltage variable control terminated. The power supply circuit 500 contains a voltage transition period determination circuit (determination circuit) 40 that contains two comparators comp1 and comp2 for determining the internal power supply voltage Vint. After the voltage transition period determination circuit 40 receives request signal req0, the comparators comp1 and comp2 operate to compare the internal power supply voltage Vint with a determination voltage (Vset+ΔV) slightly higher than the setting voltage Vset and a determination voltage (Vset−ΔV) slightly lower than the setting voltage Vset that is supplied from the internal voltage setting circuit 20. When the relation of Vset−ΔV<Vint<Vset+ΔV is satisfied, a logic circuit 60 in the voltage transition period determination circuit 40 returns an acknowledge signal ack0.

The internal voltage setting circuit 20 contains, e.g., an output transistor (not shown) in a source follower manner at the output stage. An output terminal is connected to the gate of this output transistor. The reference voltage Vref is input to a non-inverted input terminal. There is provided an operational amplifier having an inverted input terminal in feedback connection with the source of the output transistor via a resistance string circuit. A resistance value selected in the resistance string circuit is equivalent to a feedback resistance for a feedback path of the operational amplifier. The n-bit voltage setting signal vc0 selects a feedback resistance. The selected feedback resistance value determines the setting voltage Vset.

The above-mentioned step-down voltage regulator 30 comprises a series regulator or a switching regulator to be described in more detail.

The clock generation circuit 200 contains a multi-stage divider circuit that divides clock signal f0. The m-bit frequency control signal fc0 selects an output stage to determine the frequency of the operational clock signal f1.

The control circuit 300 controls operations of the power supply circuit 500 and the like. The I/O 100 inputs or outputs control signal s1, data d1, and the like from or to the outside of the chip. The memory 600 comprises, e.g., SRAM (Static Random Access Memory) and is used as a work area for the CPU 400

Figure 2:
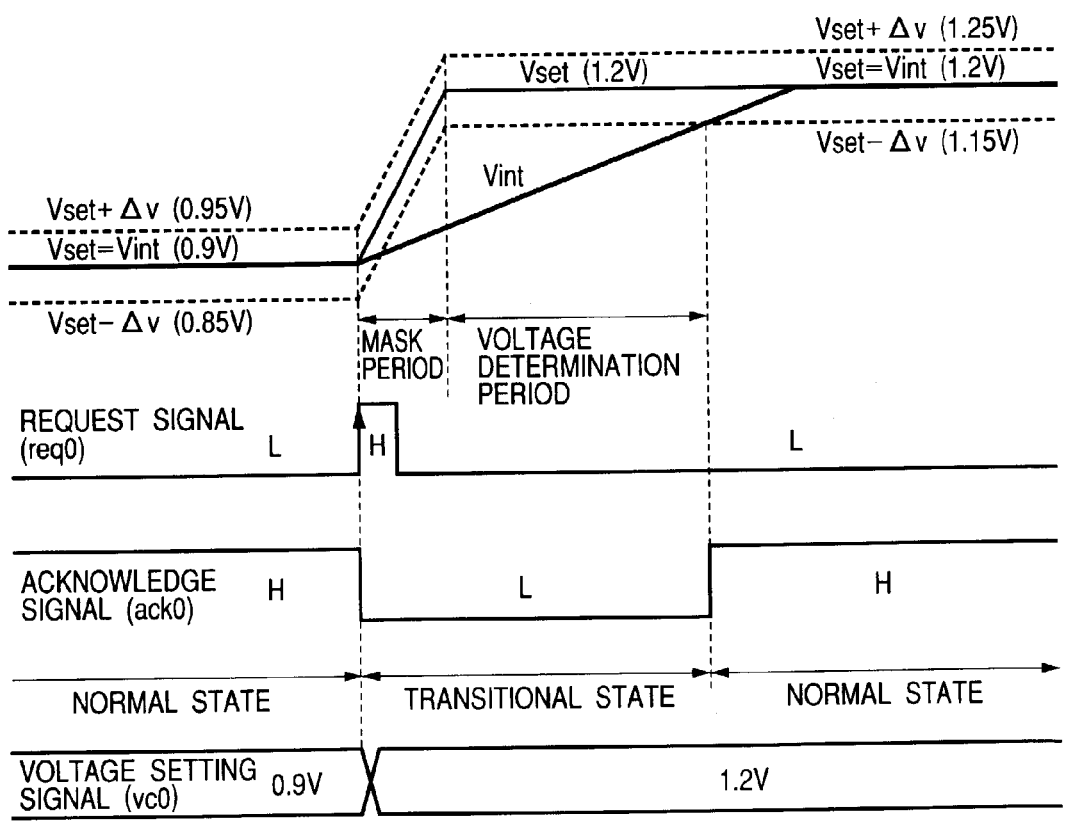
FIG. 2 is a timing chart showing signal waveforms during voltage variable control when an internal power supply voltage level is increased in the semiconductor integrated circuit of FIG. 1.

FIG. 2 shows operational waveforms during voltage variable control when increasing the level of the internal power supply voltage Vint in the semiconductor integrated circuit 1000 of FIG. 1. When the setting voltage Vset is changed from 0.9 to 1.2 V in FIG. 2, the voltage setting signal vc0 is changed almost at the same time as changing the request signal req0 from the logical level L to H. When the internal voltage setting circuit 20 in FIG. 1 receives the voltage setting signal vc0, the setting voltage Vset that was 0.9 V gradually increases to reach 1.2 V. During the transition period of the setting voltage Vset, two comparators comp1 and comp2 in the voltage transition period determination circuit 40 may compare the determination voltages (Vset+ΔV and Vset−ΔV) with the internal power supply voltage Vint. In such case, an incorrect determination result may be yielded. To solve this problem, a mask period is provided to prevent the two comparators comp1 and comp2 from malfunctioning. A simple delay circuit to be described later can be used to specify the mask period. The mask period can be short because it is not supplied with a large capacity load unlike the internal power supply voltage Vint. If the use of the delay circuit causes a time loss, it is negligibly smaller than a time loss generated when the timer circuit is used for the entire transition period of the internal power supply voltage Vint. When accepting the request signal req0, the voltage transition period determination circuit 40 uses a method of detecting a rising edge for a change in the signal req0 from the logical level L to H. This can ease restrictions on a pulse width of the request signal req0.

Upon accepting the request signal req0, the voltage transition period determination circuit 40 allows the logic circuit 60 to change the acknowledge signal ack0 from the logical level H to L. Based on this, the CPU 400 can confirm that the request signal req0 is correctly transmitted to the power supply circuit 500 and the voltage transition state takes effect. After termination of the mask period, the two comparators comp1 and comp2 in the voltage transition period determination circuit 40 start comparing the voltage level for the internal power supply voltage Vint. When the setting voltage is changed from 0.9 to 1.2 V, the internal power supply voltage Vint may be set to the voltage level between 1.15 and 1.25 V, i.e., a range between determination voltages (Vset−ΔV) and (Vset+ΔV). In this case, the logic circuit 60 changes the acknowledge signal ack0 from the logical level L to H, terminating the voltage variable control for the internal power supply voltage Vint from 0.9 to 1.2 V at this time.

Figure 3:
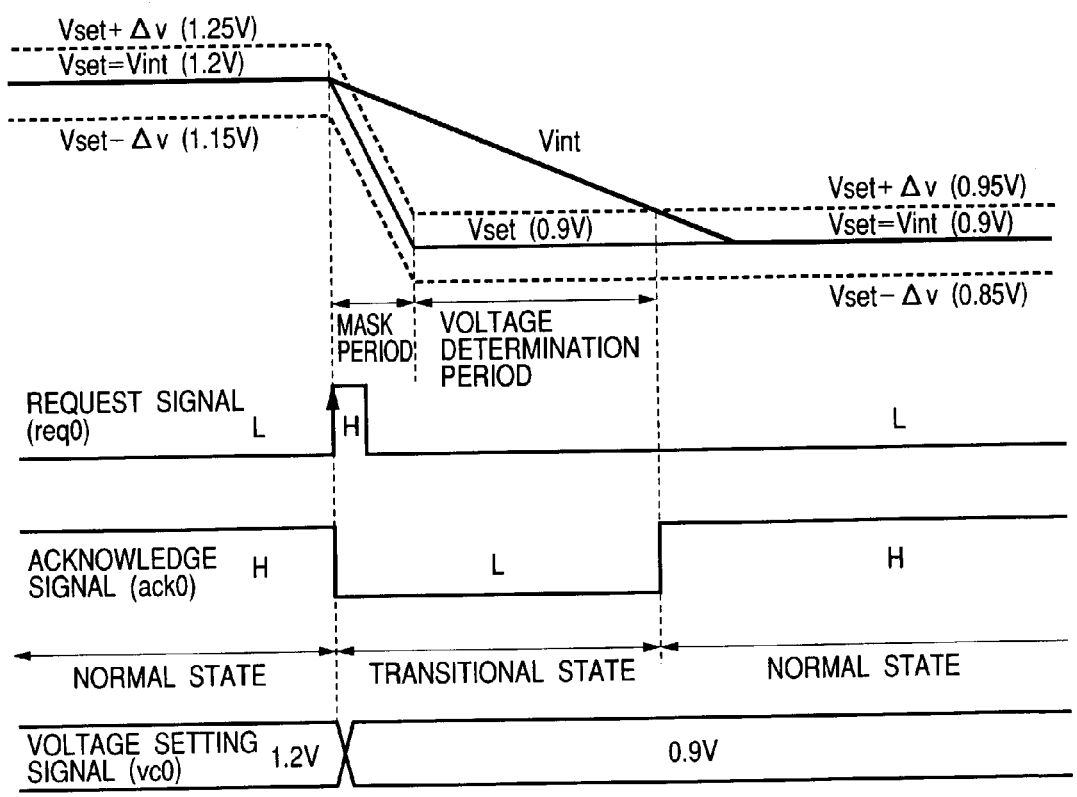
FIG. 3 is a timing chart showing signal waveforms during voltage variable control when an internal power supply voltage level is decreased in the semiconductor integrated circuit of FIG. 1.

FIG. 3 shows waveforms during voltage variable control when decreasing the level of the internal power supply voltage Vint in the semiconductor integrated circuit 1000 of FIG. 1. When the setting voltage Vset is changed from 1.2 to 0.9 V in FIG. 3, the voltage setting signal vc0 is changed almost at the same time as changing the request signal req0 from the logical level L to H. When the internal voltage setting circuit 20 in FIG. 1 receives the voltage setting signal vc0, the setting voltage Vset that was 1.2 V gradually decreases to reach 0.9 V. After termination of the mask period, the two comparators comp1 and comp2 in the voltage transition period determination circuit 40 start comparing the voltage level for the internal power supply voltage Vint. When the setting voltage Vse is changed from 1.2 to 0.9 V, the internal power supply voltage Vint may be set to the voltage level between 0.85 and 0.95 V, i.e., a range between determination voltages (Vset−ΔV) and (Vset+ΔV). In this case, the logic circuit 60 changes the acknowledge signal ack0 from the logical level L to H, terminating the voltage variable control for the internal power supply voltage Vint from 1.2 to 0.9 V at this time.

Figure 4:
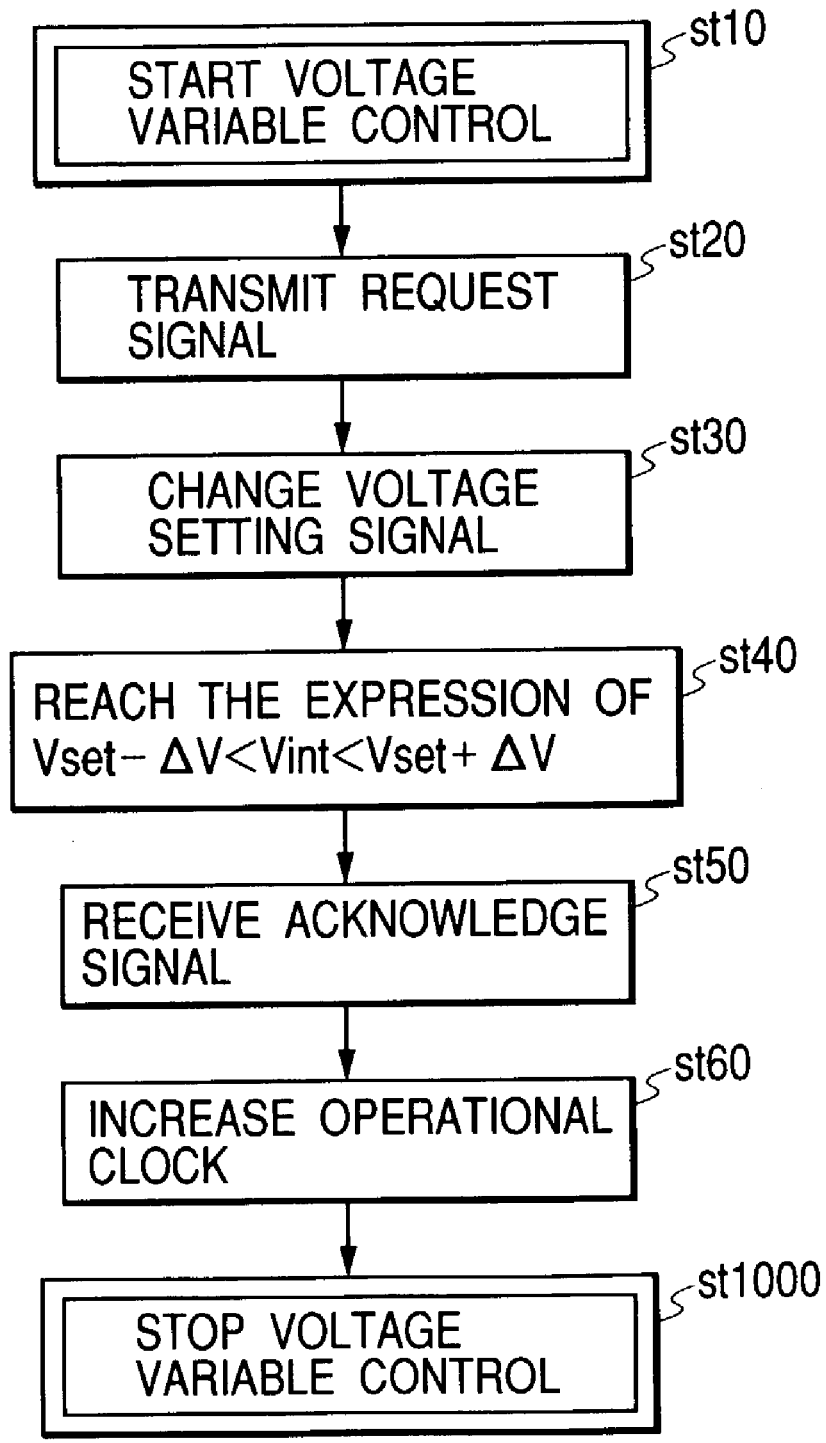
FIG. 4 is a flowchart showing a procedure of voltage variable control for increasing an internal power supply voltage and an operating frequency in the semiconductor integrated circuit of FIG. 1.

FIG. 4 exemplifies a flowchart of voltage variable control for increasing the internal power supply voltage and the operating frequency in the semiconductor integrated circuit of FIG. 1. During the voltage variable control, the operational clock signal fl is continuously supplied to the CPU 400 in FIG. 1. As shown in FIG. 4, after the voltage variable control starts (st10), the voltage setting signal is changed (st30) almost at the same time as transmission of a request signal (st20) to start changing the internal power supply voltage Vint. When the two comparators comp1 and comp2 in the voltage transition period determination circuit 40 of FIG. 1 reach the expression of Vset−ΔV<Vint<Vset+ΔV (st40), the acknowledge signal is returned (st50) to terminate the change of the internal power supply voltage Vint. Thereafter, the operating frequency is increased (st60) to terminate the voltage variable control for increasing the internal power supply voltage Vint and the operating frequency (st1000).

Figure 5:
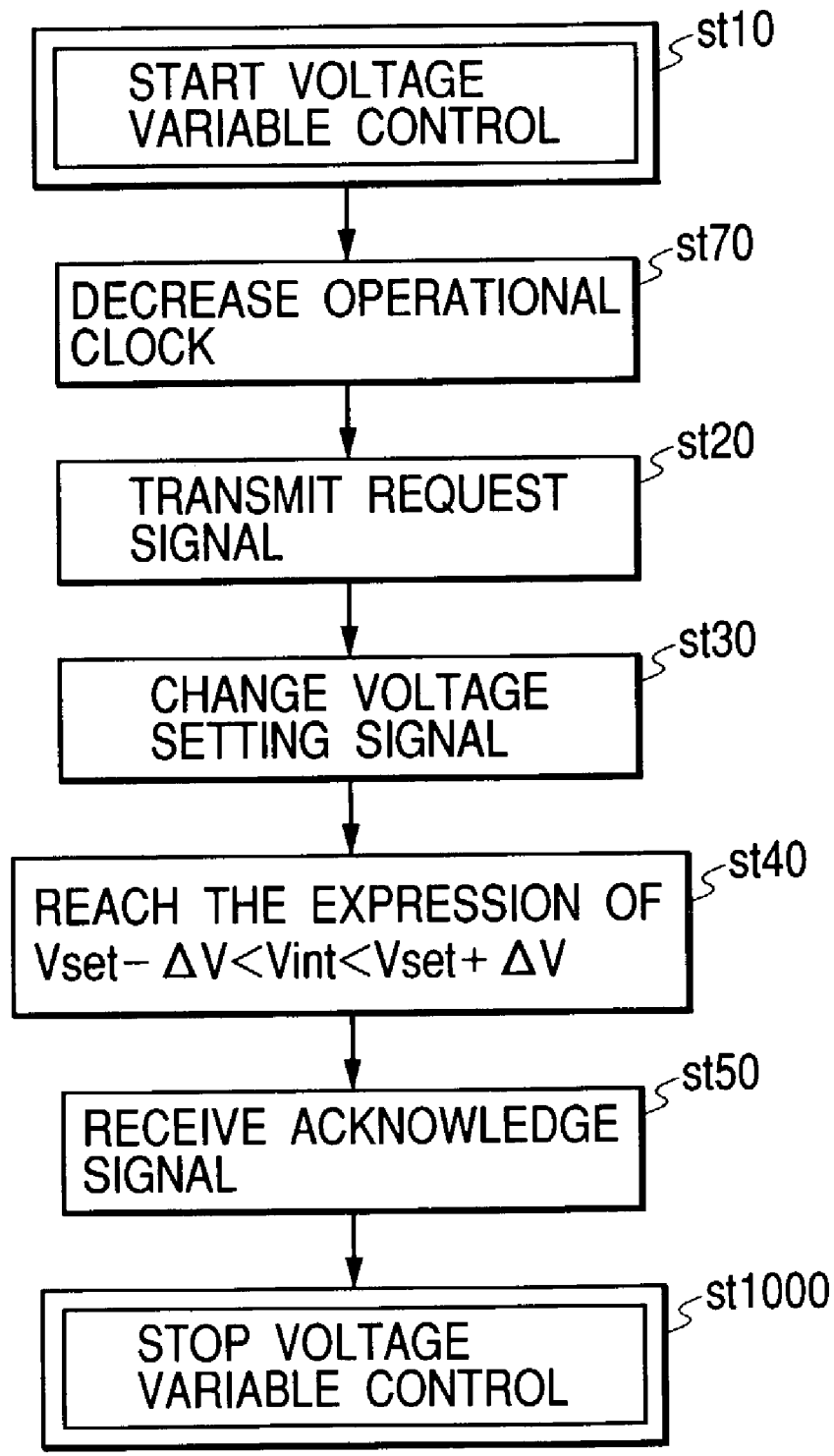
FIG. 5 is a flowchart showing a procedure of voltage variable control for decreasing an internal power supply voltage and an operating frequency in the semiconductor integrated circuit of FIG. 1.

FIG. 5 exemplifies a flowchart of voltage variable control for decreasing the internal power supply voltage Vint and the operating frequency in the semiconductor integrated circuit of FIG. 1. During the voltage variable control, the operational clock signal fl is continuously supplied to the CPU 400 in FIG. 1. As shown in FIG. 5, after the voltage variable control starts (st10), the operating frequency is decreased first (st70). The voltage setting signal is then changed (st30) almost at the same time as transmission of a request signal (st20) to start changing the internal power supply voltage Vint. When the two comparators comp1 and comp2 in the voltage transition period determination circuit 40 of FIG. 1 reach the expression of Vset−ΔV<Vint<Vset+ΔV (st40), the acknowledge signal is returned (st50) to terminate the change of the internal power supply voltage Vint. At this point, the voltage variable control for decreasing the internal power supply voltage Vint and the operating frequency is terminated (st1000).

Figure 6:
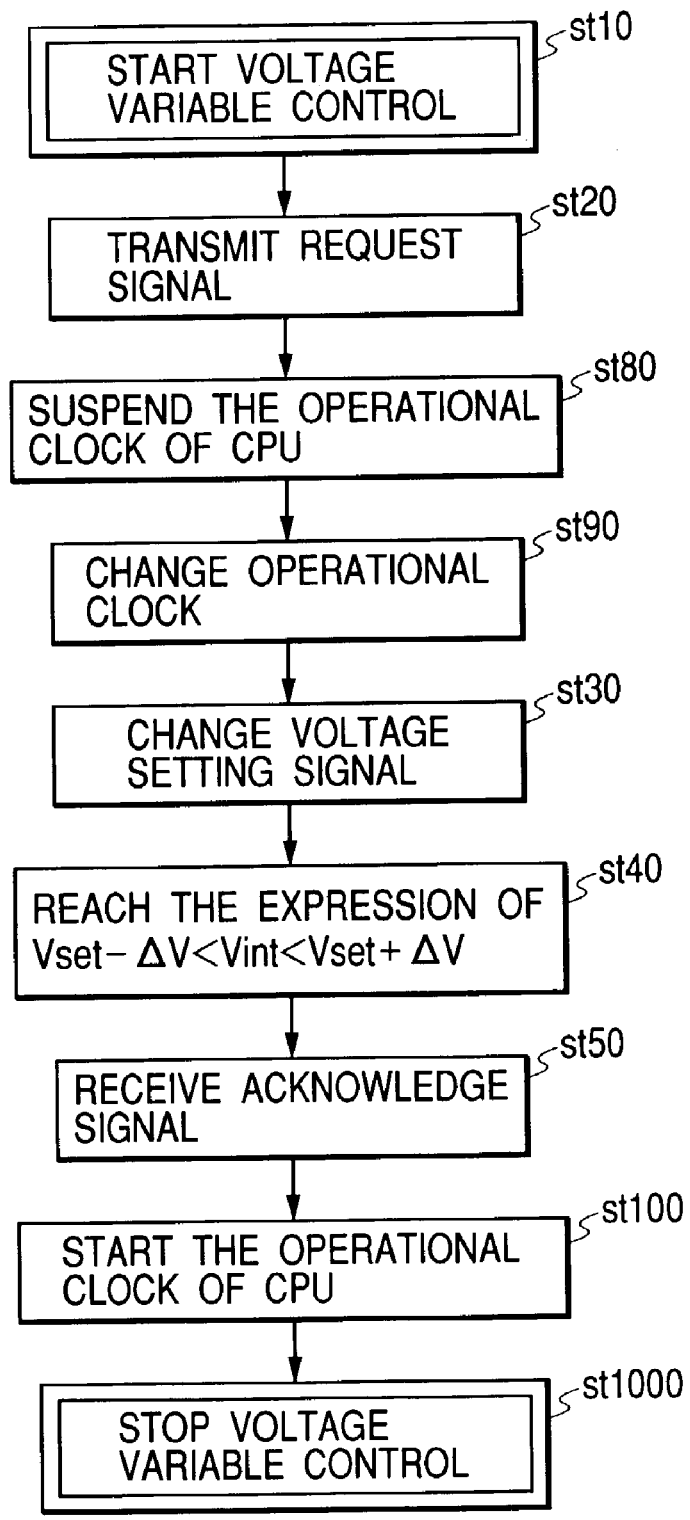
FIG. 6 is a flowchart showing another procedure of voltage variable control for changing an internal power supply voltage and an operating frequency in the semiconductor integrated circuit of FIG. 1.

FIG. 6 shows a modification of the flowcharts in FIGS. 4 and 5. As shown in FIG. 6, when the voltage variable control starts (st10), the CPU 400 in FIG. 1 first sends a request signal (st20). Then, the process stops supplying the clock signal f1 to the CPU 400 (st80). Since this stops operations of the CPU 400, its internal state becomes discontinuous before and after the voltage variable control. To solve this problem, the CPU 400 is reset after termination of the voltage variable control to reexecute data processing and the like that were executed immediately before the voltage variable control. With no clock supplied to the CPU 400 (st80), the operating frequency (st90) and the voltage setting signal (st30) are changed. The CPU 400 already stops operating when the operating frequency (st90) and the voltage setting signal (st30) are changed. Accordingly, the CPU 400 cannot directly output the voltage setting signal vcn and the frequency control signal fc0. In this case, though not shown in the figure, the control circuit 300 is provided with voltage setting signal information and frequency control signal information immediately before the suspend of the clock supplied to the CPU 400. The control circuit 300 just needs to output the voltage setting signal vcn and the frequency control signal fc0 in synchronization with transmission of the request signal (st20).

When the two comparators comp1 and comp2 in the voltage transition period determination circuit 40 reach the expression of Vset−ΔV<Vint<Vset+ΔV (st40), the acknowledge signal is returned (st50). After the acknowledge signal is returned (st50), the process restarts supplying the clock to the CPU 400 (st100) to terminate the voltage variable control (st1000).

Figures 7, 8:
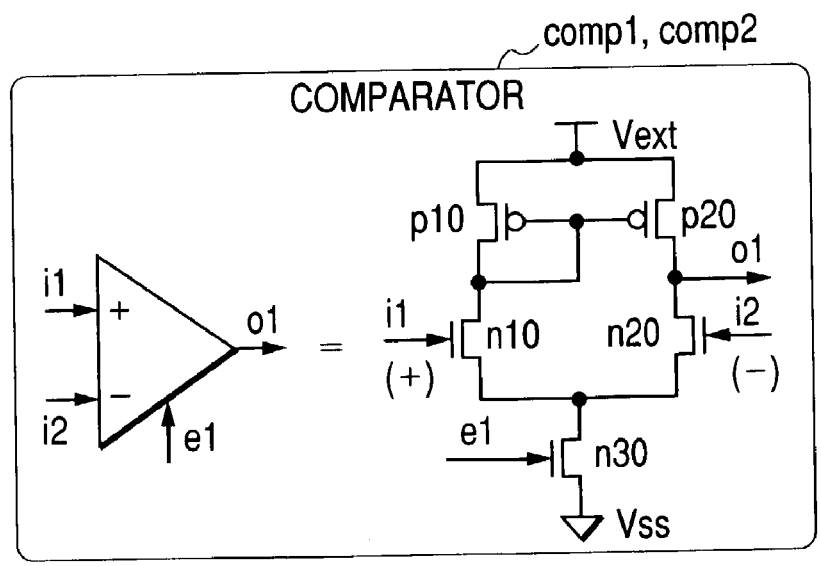
FIG. 7 is an explanatory diagram showing relationship between a setting voltage and a determination voltage in the semiconductor integrated circuit of FIG. 1.
FIG. 8 is a circuit diagram exemplifying a comparator in the semiconductor integrated circuit of FIG. 1.

FIG. 7 shows the relationship between the setting voltage (Vset) and the determination voltages (Vset+ΔV and Vset−ΔV). It is assumed that the number of bits n=2 for the voltage setting signal vcn. The internal voltage setting circuit 20 allows selection from four setting levels for the internal power supply voltage Vint. In FIG. 7, ΔV is 0.05 V. Decreasing this value improves the accuracy of the voltage transition period determination circuit 40. On the contrary, this increases possibilities of unsuccessful determination due to an offset voltage between the comparators comp1 and comp2, and the like. The voltage levels for the setting voltage Vset and the determination voltages Vset+ΔV and Vset−ΔV are not limited to those shown in FIG. 7. The number of bits n can take any value.

FIG. 8 exemplifies a circuit configuration of the comparators comp1 and comp2 in FIG. 1. The comparator in FIG. 8 comprises n-channel difference input MOS transistors n10 and n20 connected with a current mirror load comprising p-channel MOS transistors p10 and p20, and an n-channel power switch MOS transistor n30. The comparator in FIG. 8 has two difference input terminals i1 and i2 and an output terminal o1. A terminal e1 works as a power switch control terminal. While the n-channel MOS transistors configure a difference pair in FIG. 8, p-channel MOS transistors may configure an available difference pair depending on voltage levels supplied to the difference input terminals i1 and i2.

Figure 9:
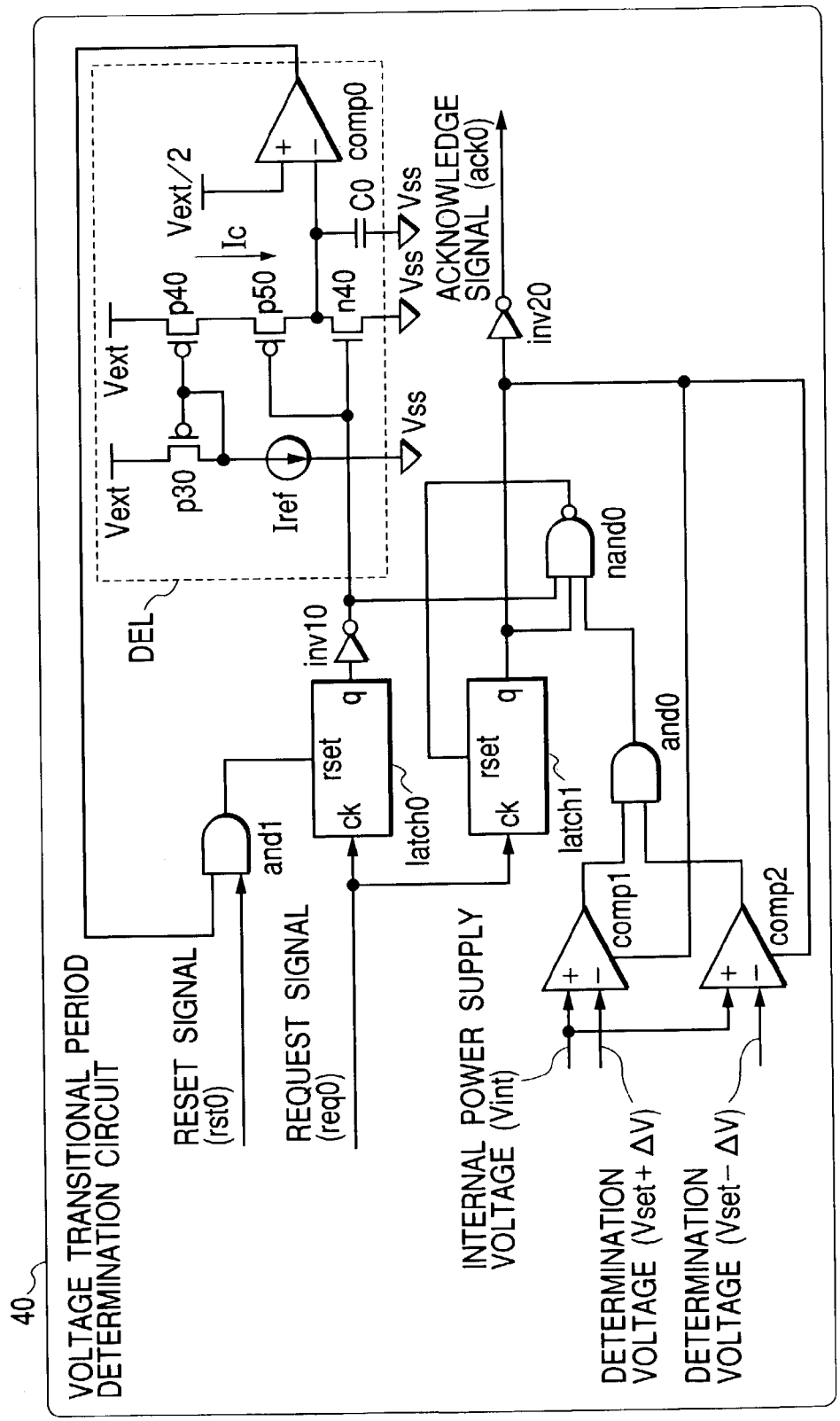
FIG. 9 shows a logic circuit diagram detailing a voltage transition period determination circuit in the semiconductor integrated circuit of FIG. 1.

FIG. 9 exemplifies details of the voltage transition period determination circuit 40. The voltage transition period determination circuit 40 comprises two comparators comp1 and comp2 for determining the internal power supply voltage Vint, the logic circuit 60 including a delay circuit, and the like. The logic circuit 60 includes two edge trigger latches latch0 and latch1. The edge trigger latches latch0 and latch1 latch the logical level H in synchronization with a rising change at clock terminal ck. The latches reset output terminal q to the logical level L in accordance with the logical level L of reset terminal rset. When the clock terminal ck is set to the logical level L or H, the output terminal q outputs already latched data. FIG. 10 exemplifies truth values concerning operations of the edge trigger latches latch0 and latch1 in FIG. 9.

The edge trigger latch latch0 uses the delay circuit DEL comprising a capacitance C0 to specify a mask period. When supplied with a rising pulse edge of the request signal req0, the edge trigger latch latch0 changes its output from L to H. The delay circuit charges the capacitance C0 with current Ic dependent on a mirror ratio of current source Iref and a current mirror load according to p-channel MOS transistors p30 and p40. A non-inverted input terminal (+) of comparator comp0 for the mask period is supplied with, as a reference voltage, a voltage half as much as the external power supply voltage Vext. While the capacitance C0 is charged, input terminals at both sides of the comparator comp0 become equal to half as much as that of the external power supply voltage Vext at a given time. At this time, an output from the comparator comp0 reverses from H to L. The edge trigger latch latch0 is reset. The mask period terminates. That is to say, the mask period corresponds to a period during which an output from inverter inv10 is set to the logical level L. The reset signal rst, set to the logical level L, forcibly resets the edge trigger latch latch0. When no reset is issued, the logical level H is activated.

The edge trigger latch latch1 specifies the voltage transition period. When the mask period terminates and the comparators comp1 and comp2 satisfy the condition of Vset−ΔV<Vint<Vset+ΔV, the edge trigger latch latch1 determines termination of the voltage transition period and generates the acknowledge signal ack0. That is to say, when supplied with a rising pulse edge of the request signal req0, the edge trigger latch latch1 changes its output from L to H. An output of the inverter inv10 changes from L to H (termination of the mask period). When output from an AND gate and0 is set to H (satisfying the condition Vset−ΔV<Vint<Vset+ΔV), output from a NAND gate nand0 is set to the low level. This resets the edge trigger latch latch1 to enable termination of the voltage transition period to be detected in accordance with a reversal of the acknowledge signal ack0 from L to H.

FIG. 11 shows an example of the step-down regulator 30. The example in FIG. 11 uses a series regulator for the step-down regulator 30. The conductance of a p-channel MOS transistor p100 is adjusted so that the setting voltage Vset becomes equal to the output voltage Vint. Resistance r100 is used for maintaining the voltage level of the output voltage Vint when no load is applied. Capacitance c5 is used for stabilizing the output voltage Vint.

FIG. 12 shows another example of the step-down regulator 30. FIG. 11 uses a switching regulator for the step-down regulator 30. A switching regulator control circuit 2000 adjusts a duty ratio dependent on a switching frequency within a specified cycle for ON and OFF states of a p-channel MOS transistor p1000 and an n-channel MOS transistor n1000. In this manner, the switching regulator operates so that an output voltage Vint of a low-pass filter becomes equal to the setting voltage Vint, wherein the low-pass filter comprises an inductance L10, a capacitance C10, and a Schottky barrier diode SBD.

Figure 13:
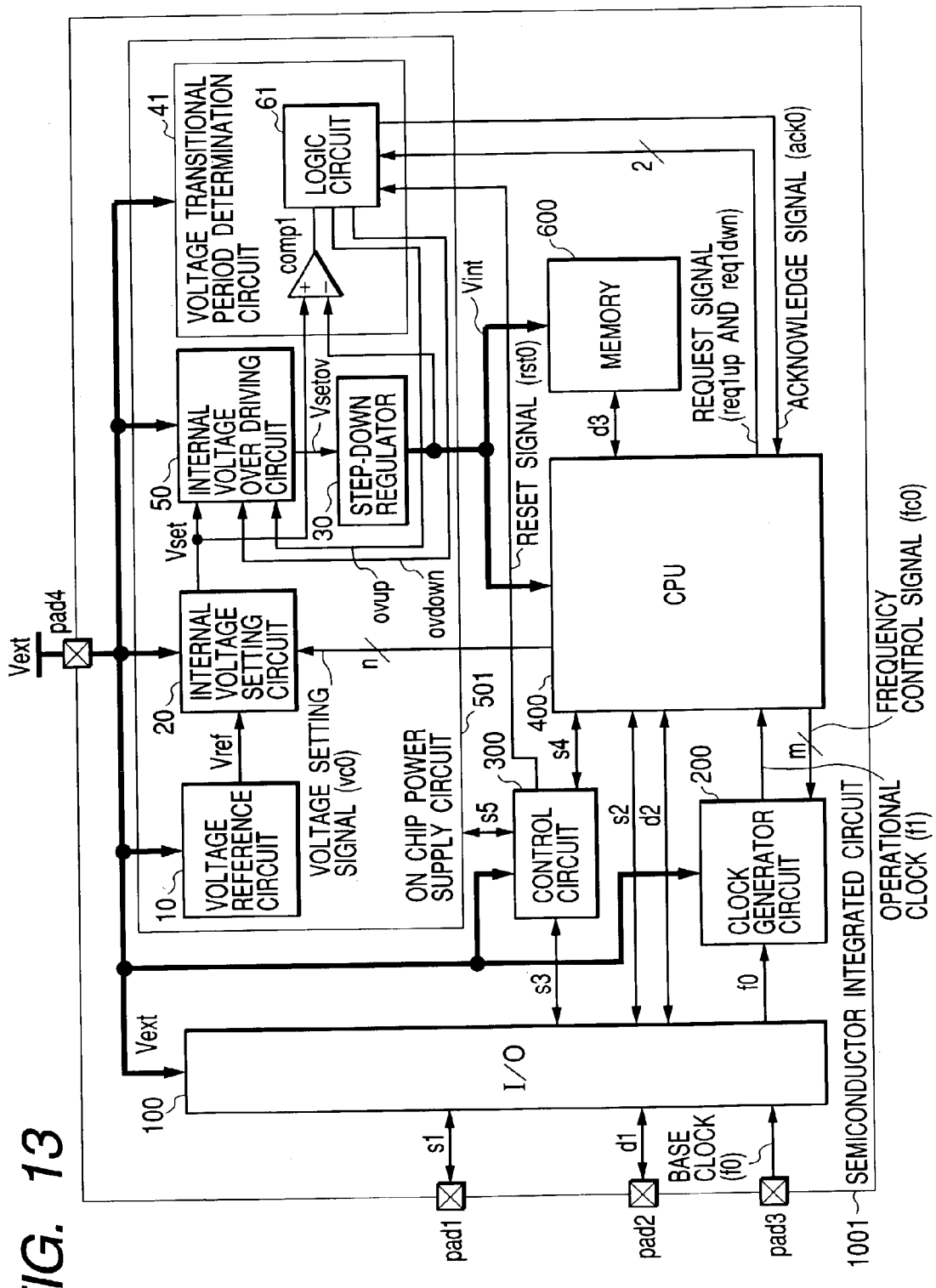
FIG. 13 is a block diagram showing a second example of the semiconductor integrated circuit according to the present invention.

FIG. 13 shows a second example of the semiconductor integrated circuit according to the present invention. A difference from the first example in FIG. 1 is the method of detecting levels of the internal power supply voltage Vint by means of the voltage transition period determination circuit. While the configuration in FIG. 1 uses the method of detecting a voltage tolerance of ±ΔV, the configuration in FIG. 13 uses an overdrive method for the internal power supply voltage Vint. As shown in FIG. 13, an on-chip power supply circuit 501 in a semiconductor integrated circuit 1001 has an internal voltage overdriving circuit 50. During the voltage transition period, the step-down regulator 30 is supplied with an overdrive voltage Vsetov slightly higher than the setting voltage Vset in order to increase the internal power supply voltage Vint higher than the setting voltage Vset dependent on the voltage setting signal vc0. Likewise, the step-down regulator 30 is supplied with the overdrive voltage Vsetov slightly lower than the setting voltage Vset in order to decrease the internal power supply voltage Vint. Accordingly, the condition Vint>Vset is satisfied in order to increase the internal power supply voltage Vint. The condition Vint<Vset is satisfied in order to decrease the internal power supply voltage Vint. The use of the internal voltage overdriving circuit 50 eliminates the need for using the two comparators comp1 and comp2 in FIG. 1. As shown in FIG. 13, a voltage transition period determination circuit 41 just needs to include one comparator comp1.

The internal voltage overdriving circuit 50 itself cannot determine whether the setting voltage Vset is increased or decreased. To solve this problem, the request signal is designed to be 2-bit signals: req1*up* and req1*dwn*. The req1*up* signal is assigned as an upward request signal when the setting voltage Vset is increased. The req1*dwn* signal is assigned as a downward request signal when the setting voltage Vset is decreased. Based on the request signal req1*up* for the increased setting voltage Vset, a logic circuit 61 in the voltage transition period determination circuit 41 sends an upward overdrive signal ovup to the internal voltage overdriving circuit 50. In this case, the internal overdriving circuit 50 generates an overdrive voltage Vsetov slightly higher than the setting voltage Vset. Based on the request signal req1*dwn* for the decreased setting voltage Vset, a logic circuit 61 in the voltage transition period determination circuit 41 sends a downward overdrive signal ovdown to the internal voltage overdriving circuit 50. In this case, the internal overdriving circuit 50 generates the overdrive voltage Vsetov slightly lower than the setting voltage Vset. The mutually corresponding circuit blocks, signals, and the like in FIGS. 13 and 1 are designated by the same reference numerals and a detailed description is omitted for simplicity.

Figure 14:
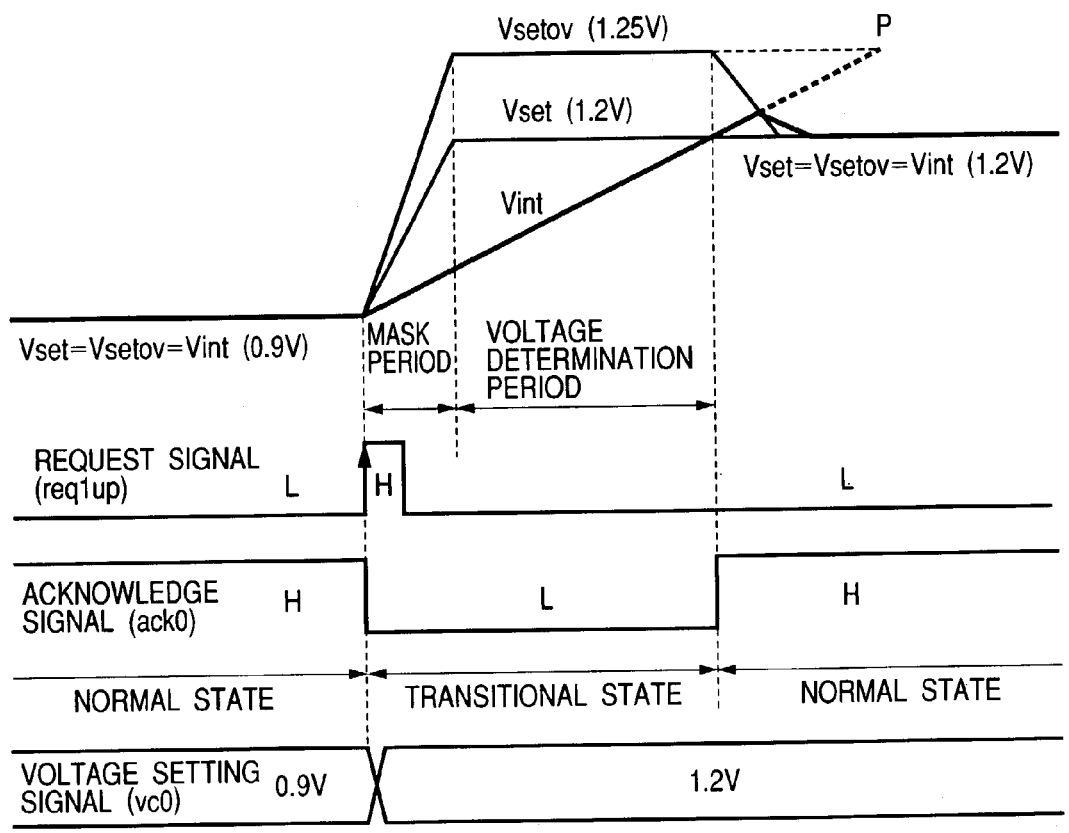
FIG. 14 is a timing chart showing signal waveforms during voltage variable control for increasing a setting voltage in the semiconductor integrated circuit of FIG. 13.

FIG. 14 shows signal waveforms during voltage variable control for increasing the setting voltage Vset in the semiconductor integrated circuit 1001 of FIG. 13. In FIG. 14, when the upward request signal req1*up* is input to change the setting voltage Vset from 0.9 to 1.2 V, for example, the setting voltage Vset and the overdrive voltage Vsetov maintain the same voltage level in a normal state. During the state transition, the setting voltage Vset changes from 0.9 to 1.2 V. On the other hand, the overdrive voltage Vsetov changes from 0.9 to 1.25 V. Accordingly, the step-down regulator 30 increases the internal power supply voltage Vint toward point P in FIG. 14 so as to reach 1.25 V, not 1.2 V. At this time, the comparator comp1 in the voltage transition period determination circuit 41 compares the setting voltage Vset with the internal power supply voltage Vint. When detecting that the condition of Vint>Vset is satisfied, the logic circuit 61 issues the acknowledge signal ack0 to notify the CPU 400 of termination of the voltage determination period. Further, the logic circuit 61 stops supplying the upward request signal req1*up* to decrease the overdrive voltage Vsetov down to 1.2 V equal to the setting voltage Vset. In this manner, the internal power supply voltage Vint finally reaches the setting voltage Vset without reaching the point P despite a slight overshoot over the setting voltage Vset. Consequently, an ending part of the voltage determination period can ensure that the internal power supply voltage Vint evidently reaches the setting voltage Vset.

FIG. 14 shows an example of using two types of voltage levels 0.9 V and 1.2 V for the setting voltage Vset. Voltage levels of the setting voltage Vset and the overdrive voltage Vsetov are not limited thereto. The upward request signal req1up and the acknowledge signal ack0 may be set to any of the H and L levels. In a normal state, the logical level for these signals is not limited to L or H.

Figure 15:
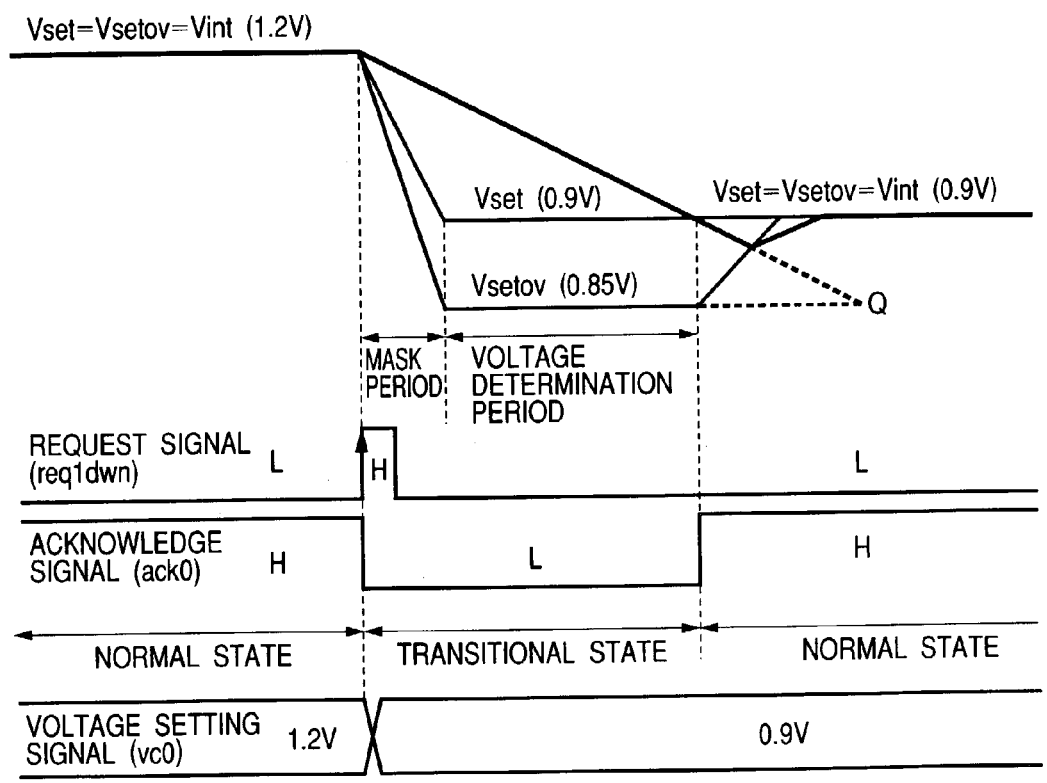
FIG. 15 is a timing chart showing signal waveforms during voltage variable control for decreasing a setting voltage in the semiconductor integrated circuit of FIG. 13.

FIG. 15 shows signal waveforms during voltage variable control for decreasing the setting voltage Vset in the semiconductor integrated circuit 1001 of FIG. 13. In FIG. 15, when the downward request signal req1dwn is input to change the setting voltage Vset from 1.2 to 0.9 V, for example, the setting voltage Vset and the overdrive voltage Vsetov maintain the same voltage level in a normal state. During the state transition, the setting voltage Vset changes from 1.2 to 0.9 V. On the other hand, the overdrive voltage Vsetov changes from 1.2 to 0.85 V. Accordingly, the step-down regulator 30 decreases the internal power supply voltage Vint toward point Q in FIG. 15 so as to reach 0.85 V, not 09 V. At this time, the comparator comp1 in the voltage transition period determination circuit 41 compares the setting voltage Vset with the internal power supply voltage Vint. When detecting that the condition of Vint<Vset is satisfied, the overdrive voltage Vsetov is increased. The internal power supply voltage Vint reaches 0.9 V indicated by the setting voltage Vset (=Vsetov) without reaching the point Q. According to this control method, the internal power supply voltage Vint slightly undershoots the setting voltage Vset. Nevertheless, an ending part of the voltage determination period can ensure that the internal power supply voltage Vint evidently reaches the setting voltage Vset.

FIG. 15 shows an example of using two types of voltage levels 0.9 V and 1.2 V for the setting voltage Vset. Voltage levels of the setting voltage Vset and the overdrive voltage Vsetov are not limited thereto. The downward request signal req1dwn and the acknowledge signal ack0 may be set to any of the H and L levels. In a normal state, the logical level for these signals is not limited to L or H.

Figure 16:
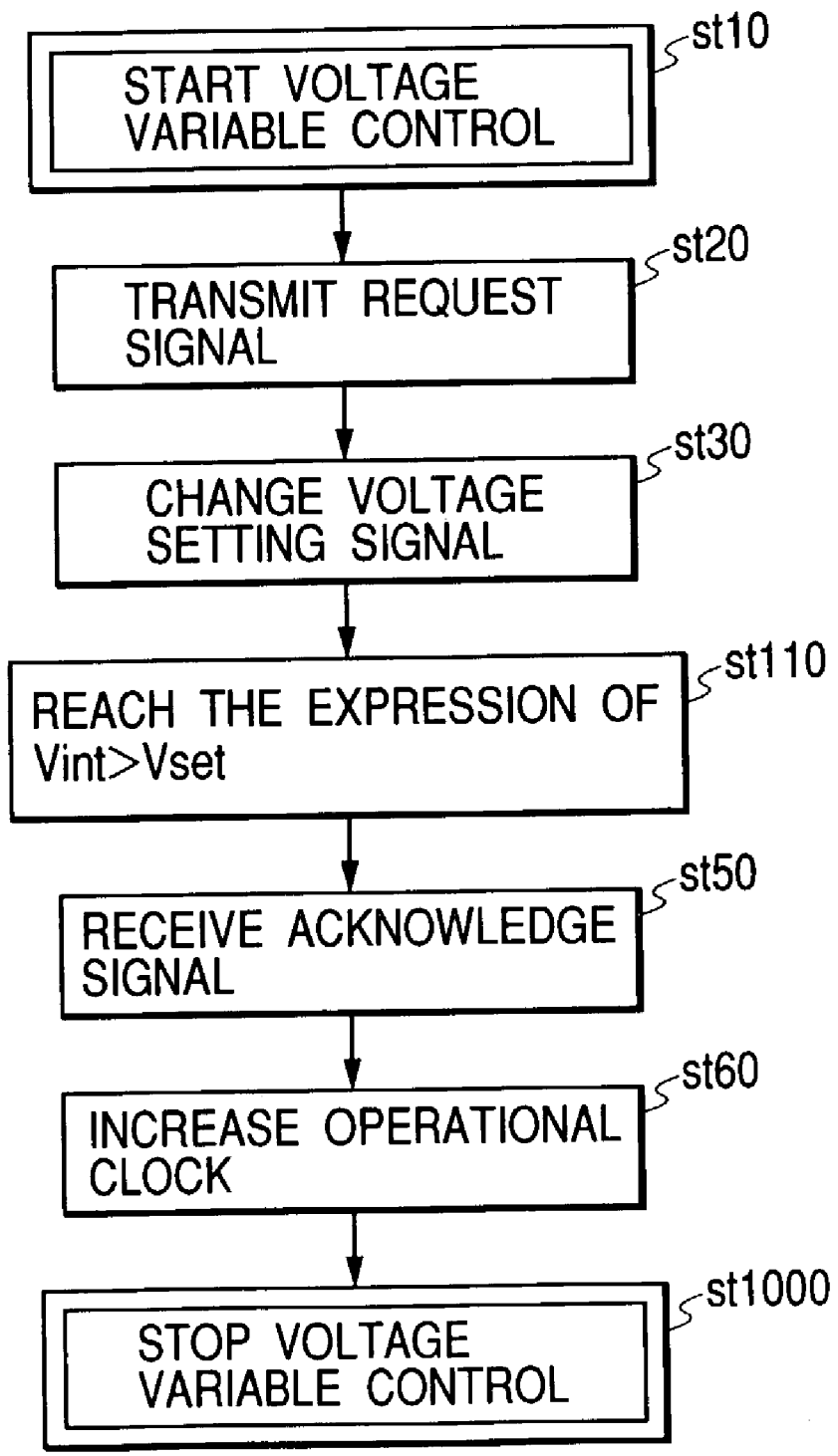
FIG. 16 is a flowchart showing a procedure of voltage variable control for increasing an internal power supply voltage and an operating frequency in the semiconductor integrated circuit of FIG. 13.

FIG. 16 exemplifies a flowchart of the voltage variable control for increasing the internal power supply voltage Vint and the operating frequency in the semiconductor integrated circuit of FIG. 13. During this voltage variable control, the operational clock signal fl is continuously supplied to the CPU 400 in FIG. 13. After the voltage variable control starts (st10) as shown in FIG. 16, the voltage setting signal is changed (st30) almost at the same time as transmission of the request signal req1up (st20) to start changing the internal power supply voltage Vint. When the comparator comp1 in the voltage transition period determination circuit 40 of FIG. 13 reaches the expression of Vint>Vset (st110), the acknowledge signal ack0 is returned (st50) to terminate the change of the internal power supply voltage Vint. Then, the operating frequency is increased (st60) to terminate the voltage variable control for increasing the internal power supply voltage Vint and the operating frequency (st1000).

Figure 17:
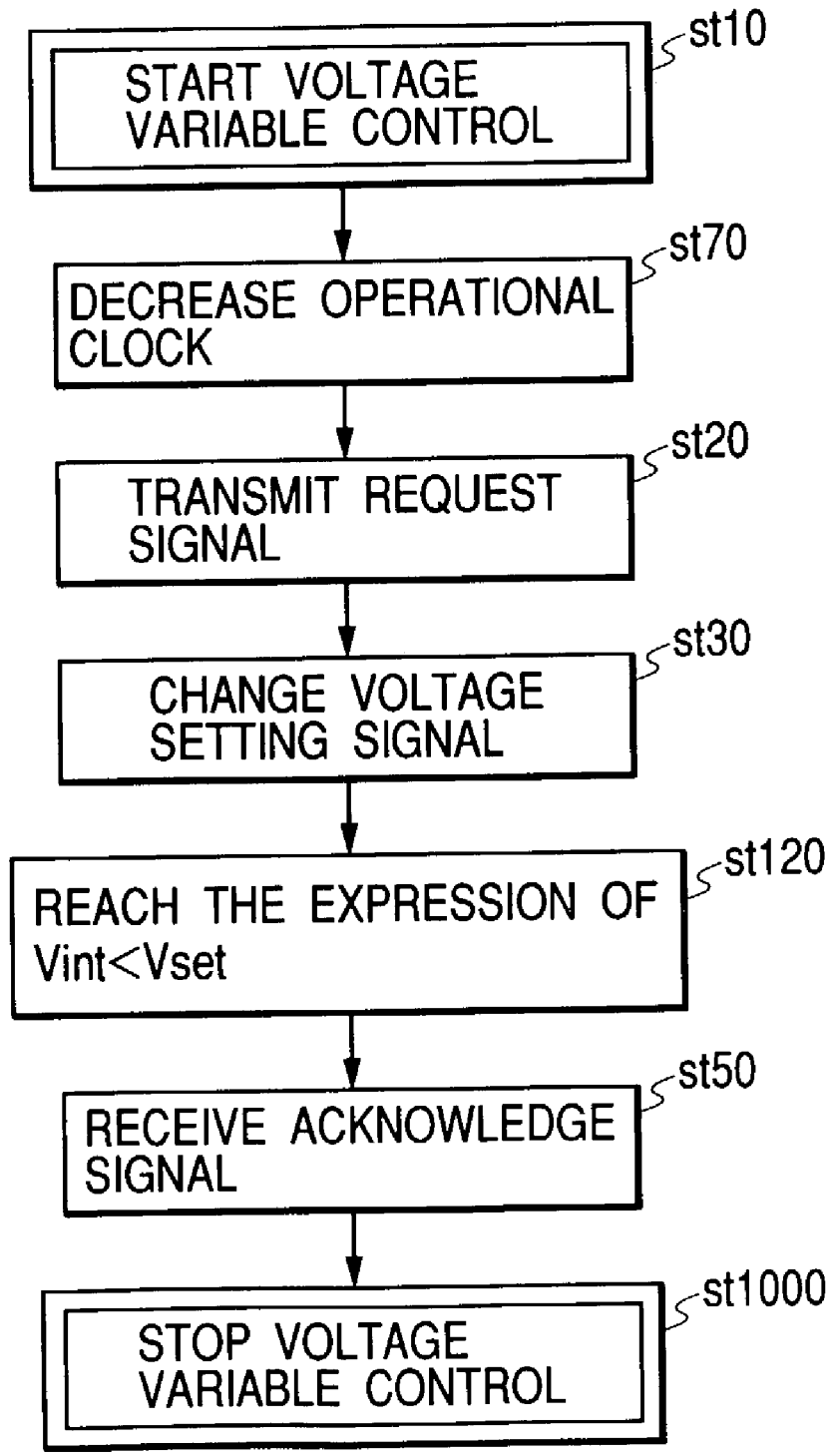
FIG. 17 is a flowchart showing a procedure of voltage variable control for decreasing an internal power supply voltage and an operating frequency in the semiconductor integrated circuit of FIG. 13.

FIG. 17 exemplifies a flowchart of the voltage variable control for decreasing the internal power supply voltage Vint and the operating frequency in the semiconductor integrated circuit of FIG. 13. During this voltage variable control, the operational clock signal fl is continuously supplied to the CPU 400 in FIG. 13. After the voltage variable control starts (st10) as shown in FIG. 17, the operating frequency is decreased first (st70). The voltage setting signal is then changed (st30) almost at the same time as transmission of the request signal req1dwn (st20) to start changing the internal power supply voltage Vint. When the comparator comp1 in the voltage transition period determination circuit 40 of FIG. 13 reaches the expression of Vint<Vset (st120), the acknowledge signal ack0 is returned (st50) to terminate the voltage variable control for decreasing the internal power supply voltage Vint and the operating frequency (st1000).

Figure 18:
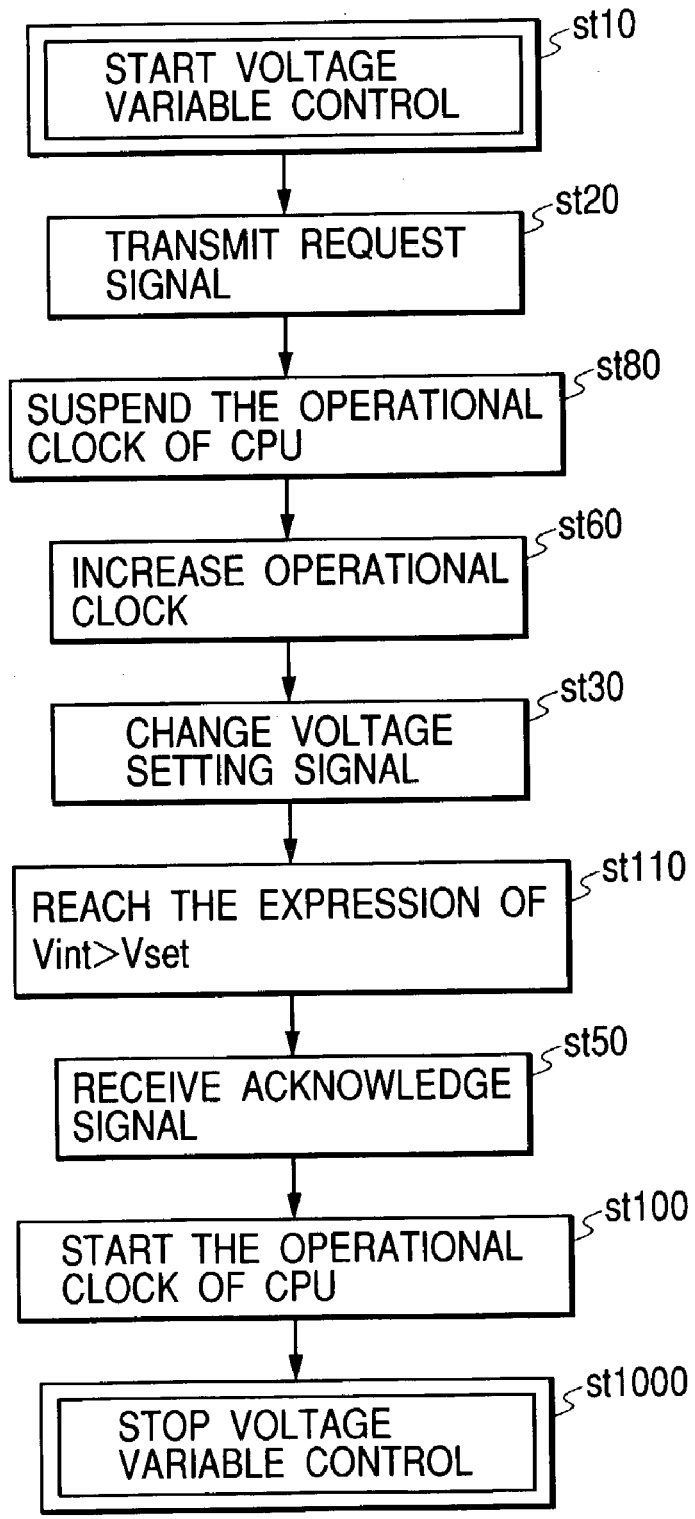
FIG. 18 is a flowchart showing another procedure of voltage variable control for increasing an internal power supply voltage and an operating frequency in the semiconductor integrated circuit of FIG. 13.

FIG. 18 shows a modification of the flowchart in FIG. 16. When the voltage variable control starts (st10) as shown in FIG. 18, the CPU 400 in FIG. 13 first sends the request signal req1up (st20). Then, the process stops supplying the clock signal f1 to the CPU 400 (st80). Since this stops operations of the CPU 400, its internal state becomes discontinuous before and after the voltage variable control. To solve this problem, the CPU 400 is reset after termination of the voltage variable control to reexecute data processing and the like that were executed immediately before the voltage variable control. With no clock supplied to the CPU 400 (st80), the operating frequency is increased (st60) and the voltage setting signal is changed (st30). The CPU 400 already stops operating when the operating frequency is increased (st60) and the voltage setting signal is changed (st30). Accordingly, the CPU 400 cannot directly output the voltage setting signal vcn and the frequency control signal fc0. In this case, though not shown in the figure, the control circuit 300 is provided with voltage setting signal information and frequency control signal information immediately before the suspend of the clock supplied to the CPU 400. The control circuit 300 just needs to output the voltage setting signal vcn and the frequency control signal fc0 in synchronization with transmission of the request signal req1up (st20).

When the comparator comp1 in the voltage transition period determination circuit 40 of FIG. 13 reaches the expression of Vint>Vset (st110), the acknowledge signal ack0 is returned (st50). After the acknowledge signal ack0 is returned (st50), the process restarts supplying the clock to the CPU 400 (st100) to terminate the voltage variable control (st1000).

Figure 19:
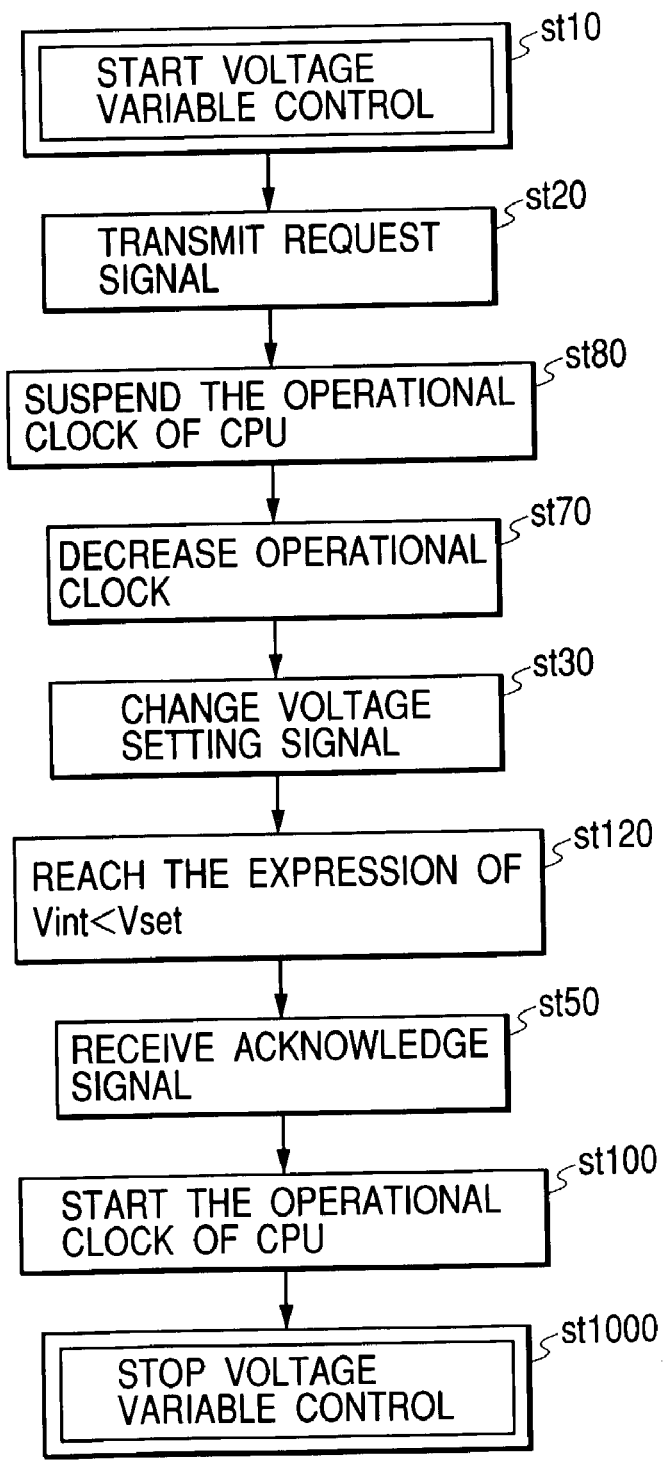
FIG. 19 is a flowchart showing another procedure of voltage variable control for decreasing an internal power supply voltage and an operating frequency in the semiconductor integrated circuit of FIG. 13.

FIG. 19 shows a modification of the flowchart in FIG. 17. When the voltage variable control starts (st10) as shown in FIG. 19, the CPU 400 in FIG. 13 first sends the request signal req1dwn (st20). Then, the process stops supplying the clock signal f1 to the CPU 400 (st80). Since this stops operations of the CPU 400, its internal state becomes discontinuous before and after the voltage variable control. To solve this problem, the CPU 400 is reset after termination of the voltage variable control to reexecute data processing and the like that were executed immediately before the voltage variable control. With no clock supplied to the CPU 400 (st80), the operating frequency is decreased (st70) and the voltage setting signal is changed (st30). The CPU 400 already stops operating when the operating frequency is increased (st70) and the voltage setting signal is changed (st30). Accordingly, the CPU 400 cannot directly output the voltage setting signal vcn and the frequency control signal fc0. In this case, though not shown in the figure, the control circuit 300 is provided with voltage setting signal information and frequency control signal information immediately before the suspend of the clock supplied to the CPU 400. The control circuit 300 just needs to output the voltage setting signal vcn and the frequency control signal fc0 in synchronization with transmission of the request signal req1dwn (st20).

When the comparator comp1 in the voltage transition period determination circuit 40 of FIG. 13 reaches the expression of Vint<Vset, the acknowledge signal ack0 is returned (st50). After the acknowledge signal ack0 is returned (st50), the process restarts supplying the clock to the CPU 400 (st100) to terminate the voltage variable control (st1000).

FIG. 20 shows the relationship between the setting voltage Vset and the overdrive voltage Vsetov in the semiconductor integrated circuit 1001 of FIG. 13. Since n is assumed to be 2 bits in FIG. 20, the internal voltage setting circuit 20 in FIG. 13 allows selection from four setting levels for the internal power supply voltage Vint. FIG. 20 shows a difference of 0.05 V between the setting voltage Vset and the overdrive voltage Vsetov. Decreasing this value also decreases an overshoot or undershoot for the internal power supply voltage Vint after termination of the transition period. On the contrary, this increases a possibility that the internal power supply voltage Vint cannot reach the setting voltage Vset successfully. The voltage levels for the setting voltage Vset and the overdrive voltage Vsetov are not limited to those shown in FIG. 20. The number of bits n can take any value.

Figure 21:
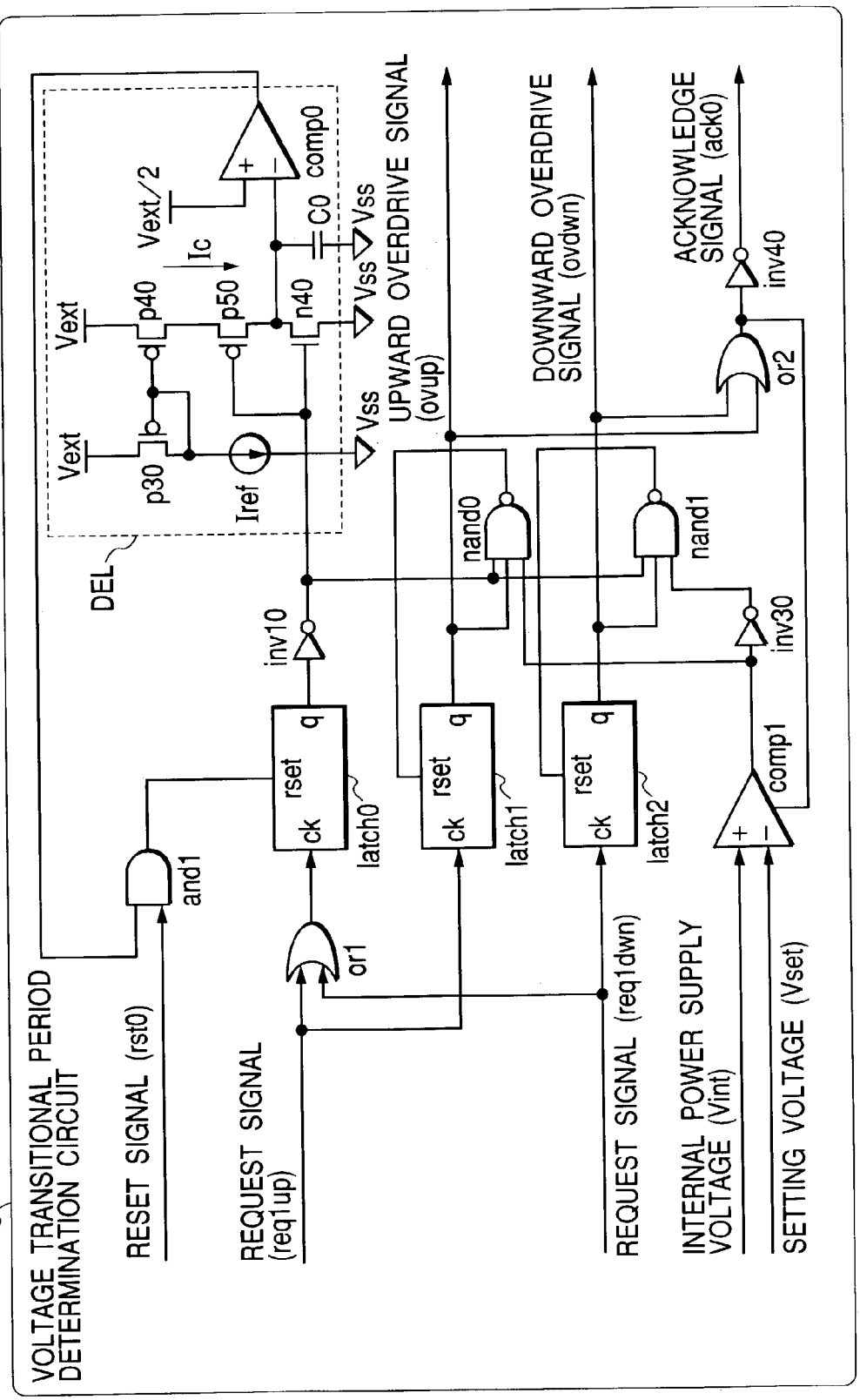
FIG. 21 is a circuit diagram exemplifying details of a voltage transition period determination circuit in the semiconductor integrated circuit of FIG. 13.

FIG. 21 exemplifies details of the voltage transition period determination circuit 41 in FIG. 13. As shown in FIG. 13, the voltage transition period determination circuit 41 comprises the comparator comp1 and the logic circuit 61 including the delay circuit. The logic circuit 61 has three edge trigger latches latch0, latch1, and latch2. Functions of the edge trigger latches latch0, latch1, and latch2 are the same as those of the edge trigger latches latch0 and latch1 described with reference to FIG. 9. The illustration is omitted for truth values concerning the functions.

As mentioned above, the edge trigger latch latch0 uses the delay circuit DEL comprising the capacitance C0 to specify the mask period. From the time when either of the request signals req1$up$ and req1$dwn$ is input, the delay circuit charges the capacitance C0 with current Ic dependent on a mirror ratio of the current source Iref and a current mirror load comprising the p-channel MOS transistors p30 and p40. One input of the comparator comp0 for the mask period is supplied with, as a reference voltage, a voltage half as much as the external power supply voltage Vext. While the capacitance C0 is charged, input terminals at both sides of the comparator comp0 become equal to half as much as that of the external power supply voltage Vext at a given time. The edge trigger latch latch0 is reset to terminate the mask period. The above-mentioned edge trigger latch latch1 specifies a voltage transition period for increasing the setting voltage Vset. The edge trigger latch latch1 receives the upward request signal req1$up$ and sends the upward overdrive signal ovup to increase the overdrive voltage Vsetov. The edge trigger latch latch1 determines termination of the voltage transition period based on termination of the mask period and establishment of the relationship Vint>Vset by means of the comparator comp1. The edge trigger latch latch1 outputs the acknowledge signal ack0 as a determination result. On the other hand, the above-mentioned edge trigger latch latch2 specifies a voltage transition period for decreasing the setting voltage Vset. The edge trigger latch latch2 receives the downward request signal req1$dwn$ and sends the downward overdrive signal ovdown to decrease the overdrive voltage Vsetov. The edge trigger latch latch2 determines termination of the voltage transition period based on termination of the mask period and establishment of the relationship Vint<Vset by means of the comparator comp1. The edge trigger latch latch2 outputs the acknowledge signal ack0 as a determination result.

Figure 22:
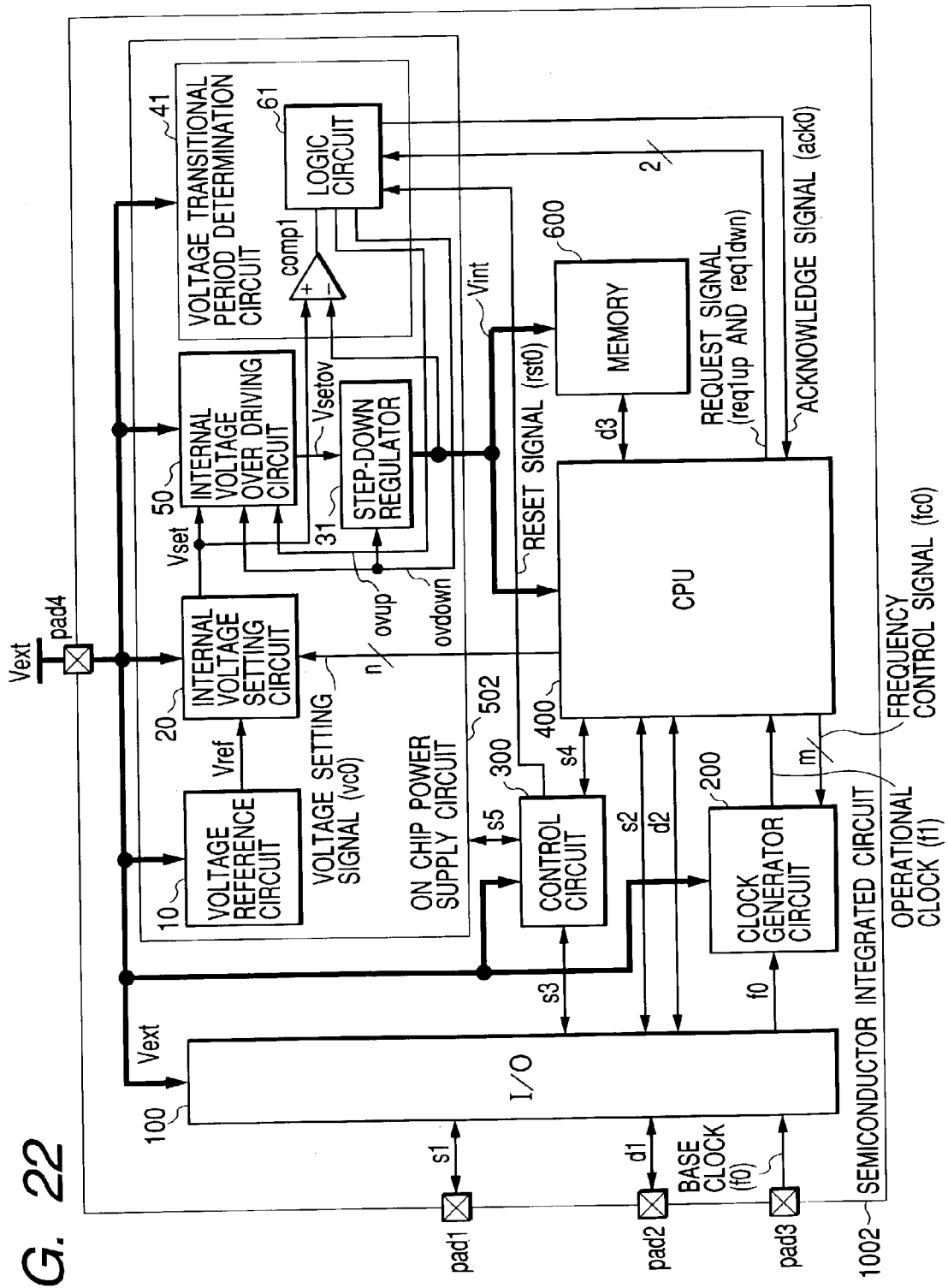
FIG. 22 is a block diagram showing a third example of the semiconductor integrated circuit according to the present invention.

FIG. 22 shows a modification of the semiconductor integrated circuit in FIG. 13. A semiconductor integrated circuit 1002 in FIG. 22 contains an on-chip power supply circuit 502 that is provided with a step-down regulator 31. The step-down regulator 31 has a pass for discharging the internal power supply voltage Vint to the ground in accordance with the downward overdrive signal ovdown generated from the voltage transition period determination circuit 41. This is a difference from FIG. 13. The mutually corresponding circuit modules and the like having the same functions in FIGS. 22 and 13 are designated by the same reference numerals and a detailed description is omitted for simplicity.

Figure 23:
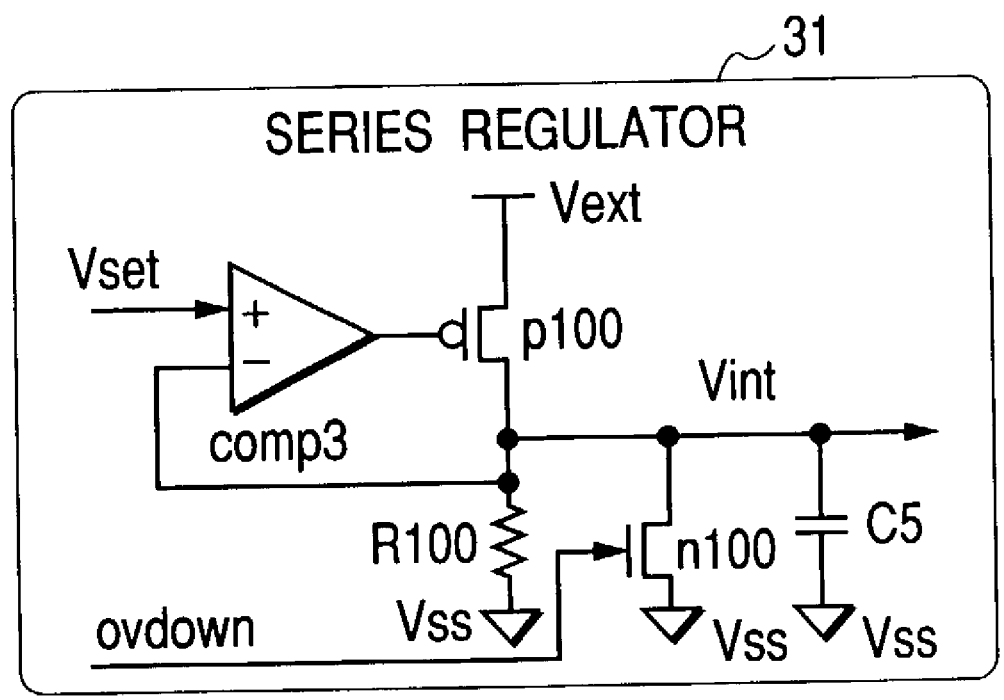
FIG. 23 is a circuit diagram exemplifying details of a step-down regulator in the semiconductor integrated circuit of FIG. 22.

FIG. 23 exemplifies a circuit configuration of the step-down regulator 31 in FIG. 22. It may be preferable to use a series regulator as the step-down regulator 31 having a pass capable of short-circuiting to earth potential (ground) of a circuit. Generally, when the series regulator is used to decrease the output voltage Vint level, the stabilization capacitance c5 lengthens the voltage transition period. The voltage transition period can be shortened when the downward overdrive signal ovdown is used to operate a pass for discharging to the ground due to an n-channel MOS transistor n100.

Figure 24:
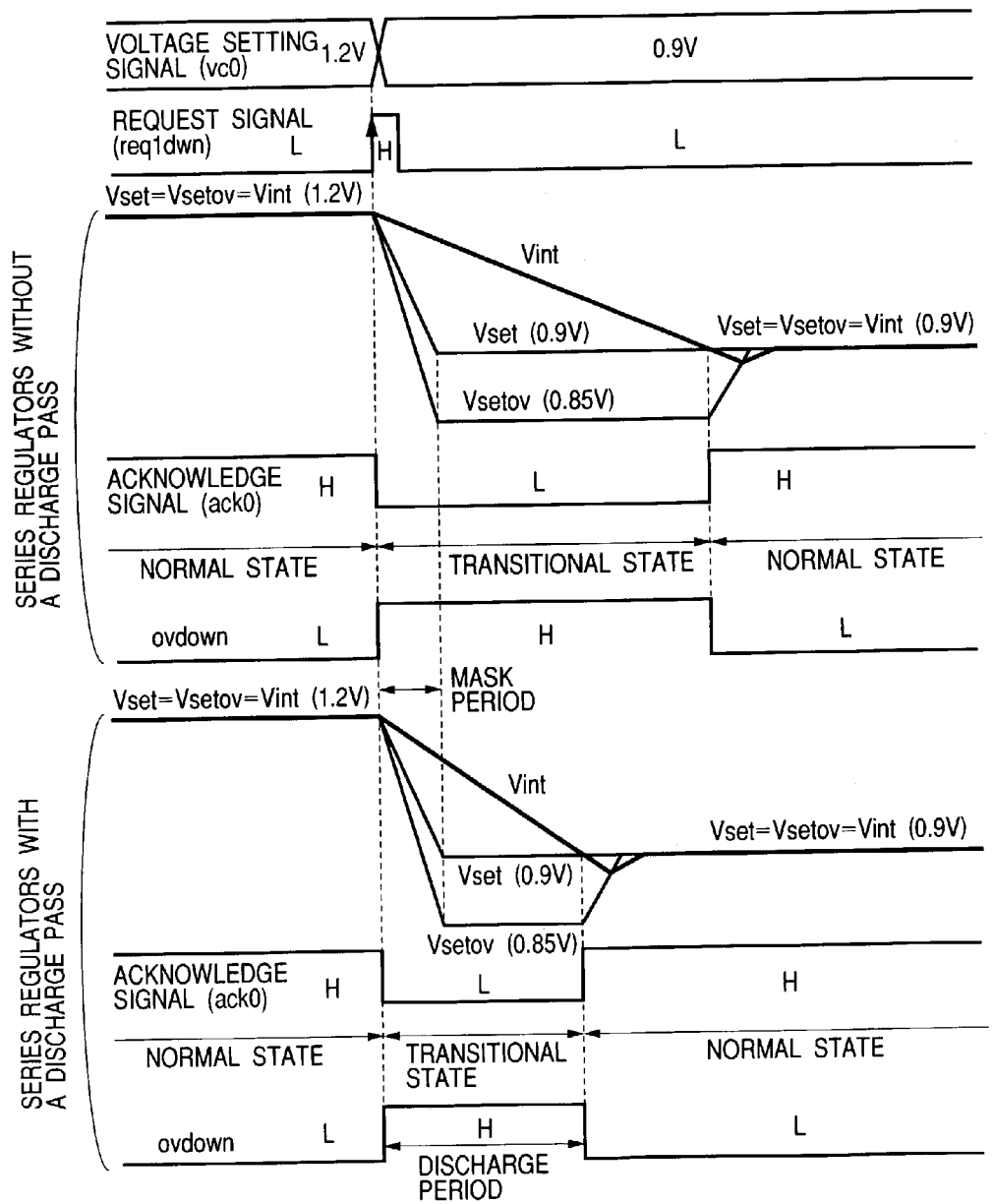
FIG. 24 is a timing chart showing comparison of signal waveforms due to voltage variable control for decreasing a setting voltage in case of using series regulators without a discharge pass and series regulators with a discharge pass in FIG. 23 as step-down regulators.

FIG. 24 shows an example of comparing signal waveforms during the voltage variable control for decreasing the setting voltage Vset by using series regulators without a discharge pass in FIG. 11 and series regulators with a discharge pass in FIG. 23 as the step-down regulator 31. Compared to the former, the latter shortens the processing time for decreasing the internal power supply voltage Vint due to a forced discharge by means of the MOS transistor n100. FIG. 24 shows an example of using two types of voltage levels 0.9 V and 1.2 V for the setting voltage Vset. Voltage levels of the setting voltage Vset and the overdrive voltage Vsetov are not limited thereto. Any voltages may be used for the logical levels H and L for the downward request signal req1$dwn$, the acknowledge signal ack0, and the overdrive signals ovdown and ovup. In a normal state, the logical level for these signals is not limited to L or H.

Figure 25:
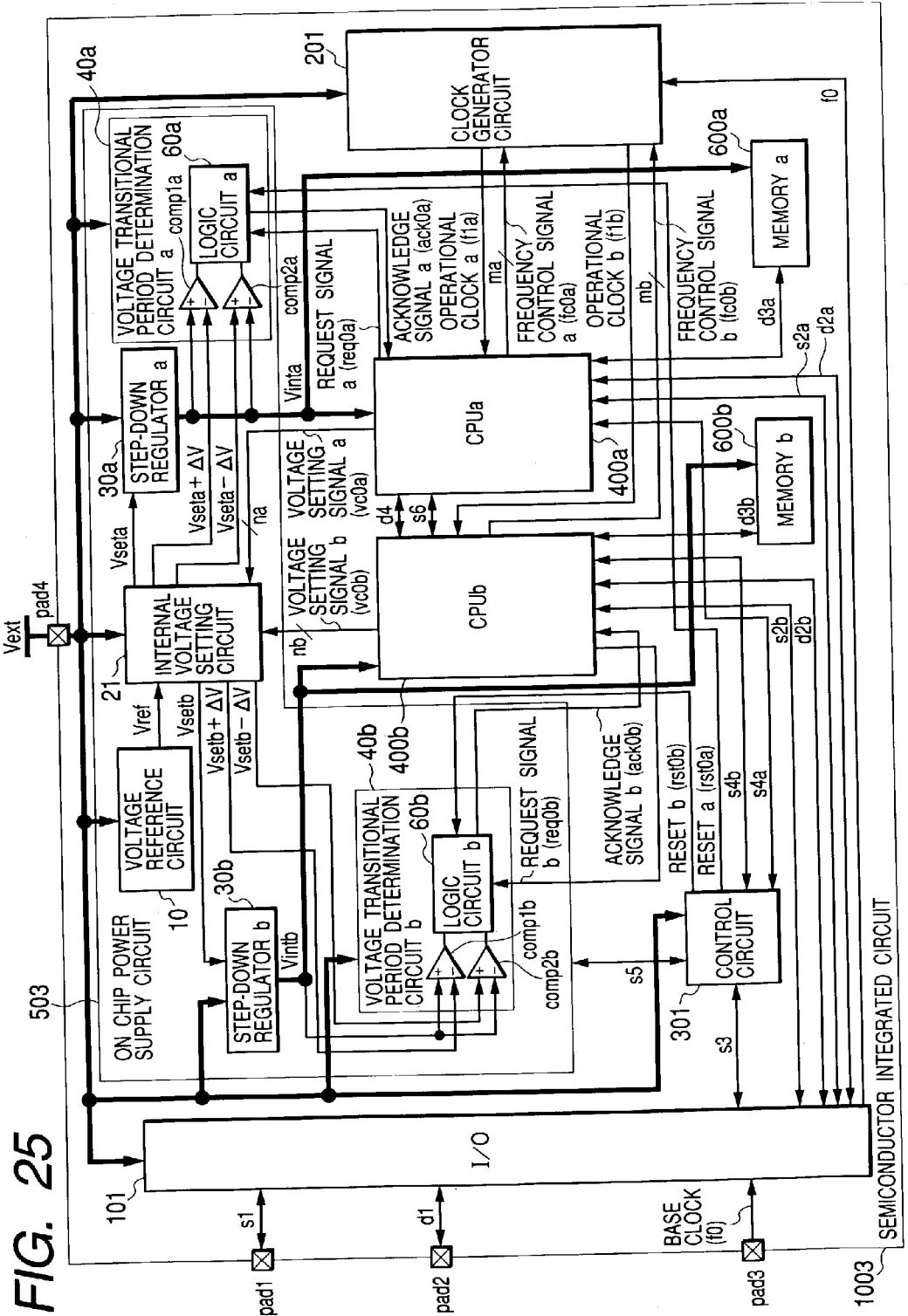
FIG. 25 is a block diagram showing a fourth example of the semiconductor integrated circuit according to the present invention.

FIG. 25 shows a modification of the semiconductor integrated circuit in FIG. 1. A semiconductor integrated circuit 1003 in FIG. 25 uses two CPUs CPUa and CPUb. One CPUa operates by receiving an operational clock signal f1$a$ generated from a clock generation circuit 201 and an internal power supply voltage Vinta stepped down by a step-down regulator 30$a$ in an on-chip power supply circuit 503 from the power supply voltage Vext used for an interface between chips. The other CPUb operates by receiving an operational clock signal f1b generated from the clock generation circuit 201 and an internal power supply voltage Vintb stepped down by a step-down regulator 30$b$ in the on-chip power supply circuit 503 from the power supply voltage Vext used for an interface between chips. There are provided two voltage transition period determination circuits 40$a$ and 40$b$ to independently perform the voltage variable control for the CPUa and CPUb. The control function of the voltage transition period determination circuits 40$a$ and 40$b$ is the same as that of the voltage transition period determination circuit 40 in FIG. 1, and a detailed description is omitted for simplicity. The use of more CPUs may increase types of internal power supply voltages. In such case, it is just necessary to increase the number of voltage transition period determination circuits in proportion to the types of internal power supply voltages.

FIG. 26 exemplifies the relationship among the setting voltages Vseta and Vsetb and corresponding determination voltages Vseta+$\Delta$V, Vseta−$\Delta$V, Vsetb+$\Delta$V, and Vsetb−$\Delta$V in the semiconductor integrated circuit of FIG. 25. FIG. 26 assumes na=2 bits and nb=2 bits. The internal voltage setting circuit 21 allows selection from four setting levels for the internal power supply voltages Vinta and Vintb. The voltage levels for the setting voltages Vseta and Vsetb and the determination voltages Vseta+ΔV, Vseta−ΔV, Vsetb+ΔV, and Vsetb−ΔV are not limited to those shown in FIG. 26. The number of bits na and nb can take any values.

Figure 27:
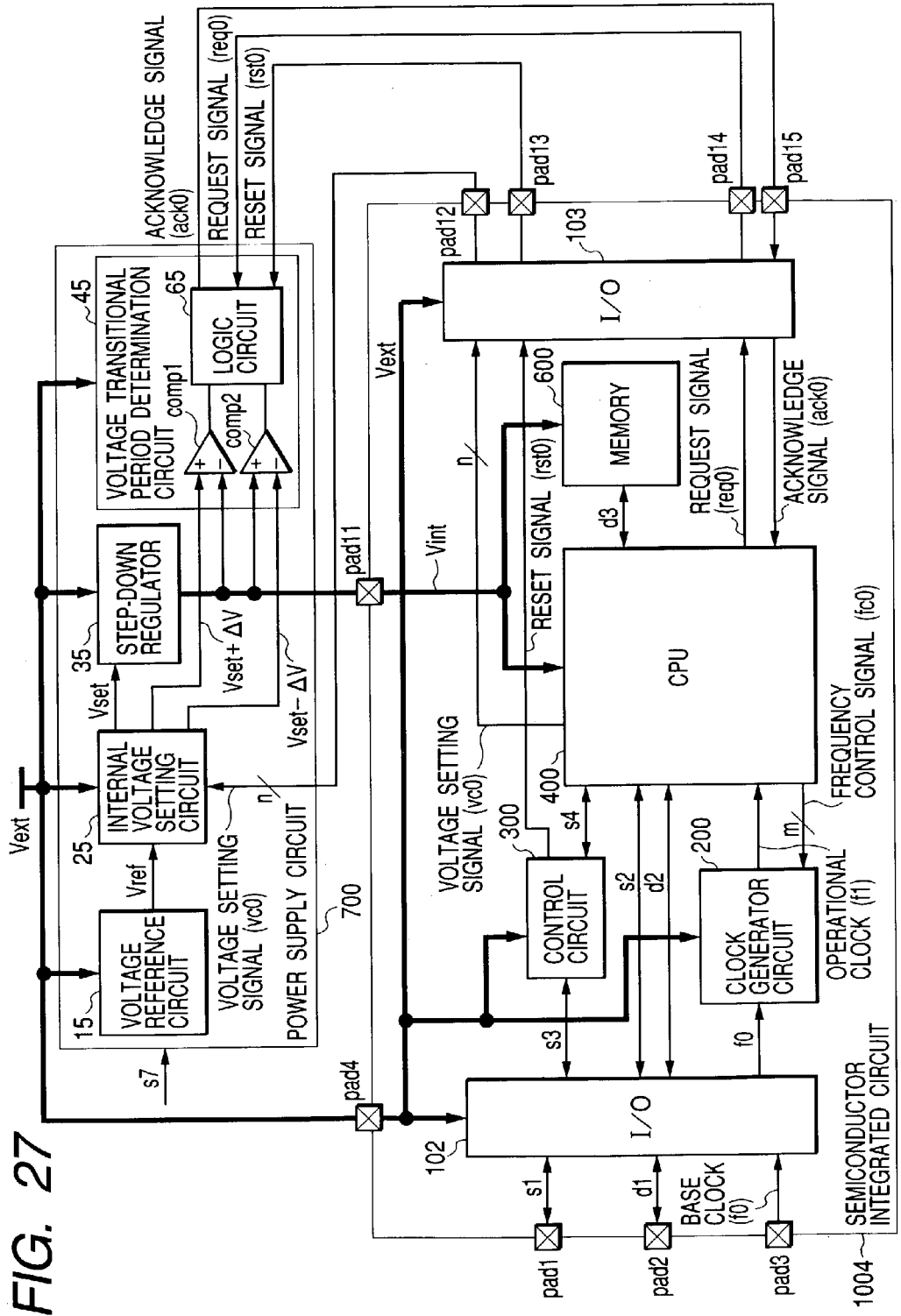
FIG. 27 is a block diagram showing a first example of the power supply circuit according to the present invention.

FIG. 27 shows an example of using external parts to configure the power supply circuit in the semiconductor integrated circuit of FIG. 1. The example in FIG. 27 configures a power supply circuit 700 having the function equivalent to that of the on-chip power supply circuit 500 outside a semiconductor integrated circuit 1004. That is to say, the power supply circuit 700 is equivalent to the voltage reference circuit 10, the internal voltage setting circuit 20, the step-down regulator 30, and the voltage transition period determination circuit 40 provided by the on-chip power supply circuit 500 in the semiconductor integrated circuit 1000 of FIG. 1.

Figure 28:
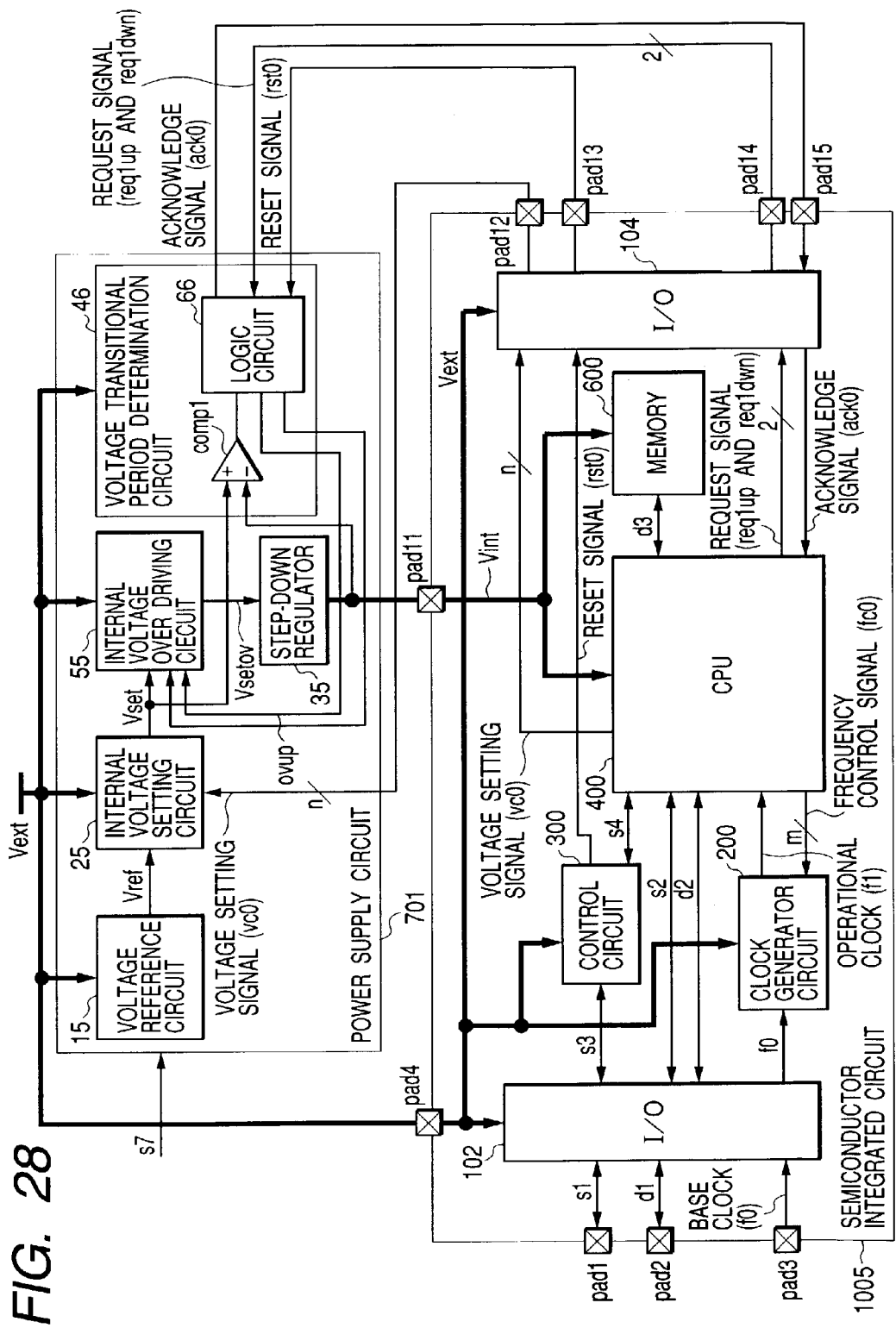
FIG. 28 is a block diagram showing a second example of the power supply circuit according to the present invention.

FIG. 28 shows an example of using external parts to configure the power supply circuit in the semiconductor integrated circuit of FIG. 13. The example in FIG. 28 configures a power supply circuit 701 having the function equivalent to that of the on-chip power supply circuit 501 outside a semiconductor integrated circuit 1005. That is to say, the power supply circuit 701 is equivalent to the voltage reference circuit 10, the internal voltage setting circuit 20, the overdrive circuit 50, the step-down regulator 30, and the voltage transition period determination circuit 41 provided by the on-chip power supply circuit 501 in the semiconductor integrated circuit 1001 of FIG. 13.

Figure 29:
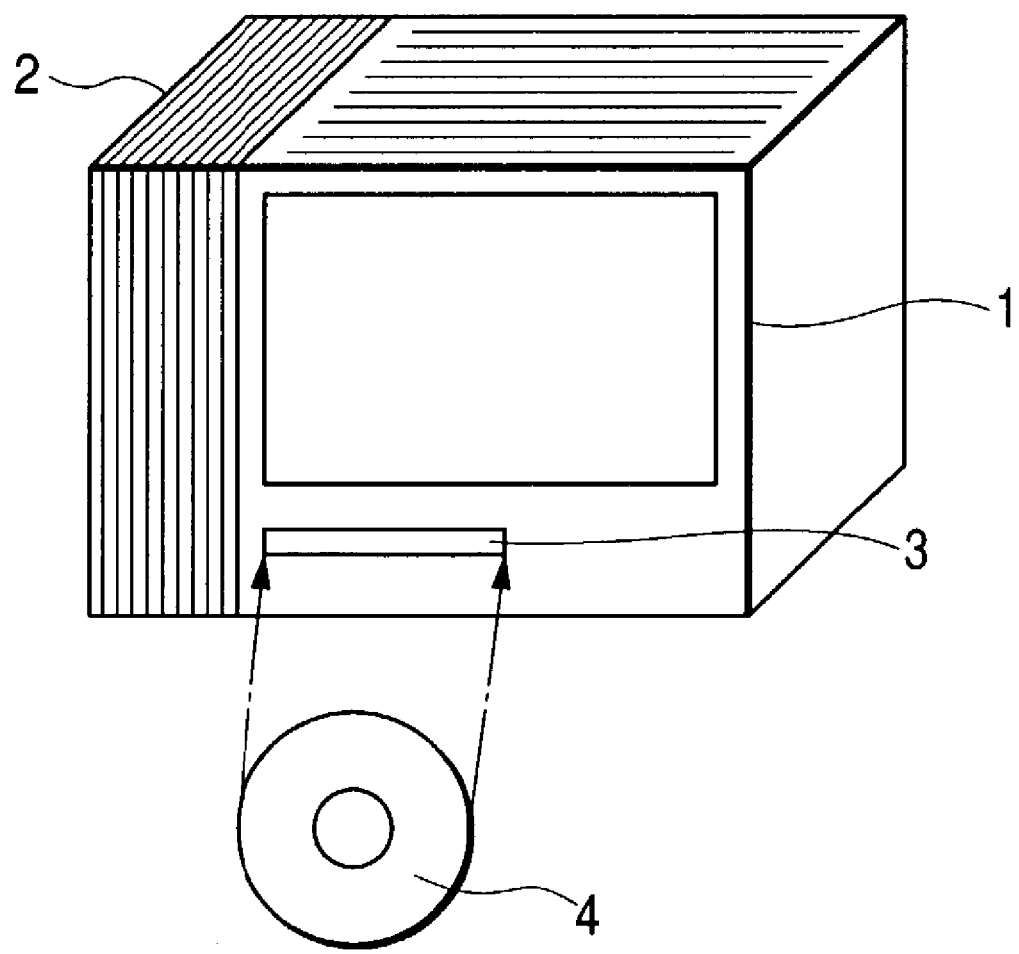

FIG. 29 schematically exemplifies a design system used for the logic design, the circuit design, the layout design, and the like of the above-mentioned semiconductor integrated circuit and the like. The design system comprises a computer 1 such as an engineering workstation and a large-size auxiliary storage 2 such as a hard disk apparatus. The computer 1 has a disk drive apparatus 3 and reads programs or design data for use from an information recording medium 4 mounted on the disk drive apparatus 3. For example, the information recording medium 4 can be CD-ROM (Compact Disc-Read Only Memory), DVD (Digital Video Disc), MO (Magnet-Optics), a flexible disk, or the like.

For example, the information recording medium 4 records design data about a power supply circuit such as the power supply circuit 500, 501, 502, or 503 in a computer-readable manner. The design data is written in a hardware description language such as so-called HDL and provides soft IP module data specifying the logic circuit configuration or hard IP module data specifying circuits in the form of pattern data for photo masks or mask pattern data for electron beam lithography. Each IP module data is provided with not only design data, but also logical verification data in accordance with logical simulation and the like.

Since there is provided the information recording medium that stores the design data, the design data can be made available more easily than creating design data from scratch. It is possible to facilitate the design of the power supply circuit that hardly causes an unnecessary operation time for variable control over the operating frequency and the internal power supply voltage for saving power consumptions. Further, it is possible to help decrease the number of processes for designing the semiconductor integrated circuit having such power supply circuit on chip.

While there have been described specific preferred embodiments of the present invention made by the inventors, it is to be distinctly understood that the present invention is not limited thereto but may be otherwise variously embodied within the spirit and scope of the invention.

For example, it is possible to appropriately change the voltages Vext, Vint, Vset, ΔV, and Vsetov. Moreover, the present invention is also applicable when a voltage regulator increases the external power supply voltage to generate the internal power supply voltage Vint. The first voltage is not limited to the external power supply voltage of the semiconductor integrated circuit.

The following concisely describes effects obtained by representative aspects of the present invention disclosed in the application concerned.

That is to say, the semiconductor integrated circuit and the power supply circuit according to the present invention hardly cause an unnecessary operation time for variable control over the operating frequency and the internal power supply voltage (second power supply voltage) for saving power consumptions and easily prevent prolongation of a circuit design period needed for the variable control. The information recording medium according to the present invention helps facilitate the design of the power supply circuit and the semiconductor integrated circuit.

What is claimed is:

1. A semiconductor integrated circuit comprising:
   a CPU;
   a clock generation circuit which supplies an operational clock signal to the CPU, a frequency of the operational clock signal being specified from the CPU; and
   a power supply circuit including:
      a voltage regulator which is coupled to receive an external power supply voltage and which provides an internal power supply voltage from the external power supply voltage, a voltage value of the internal power supply voltage being specified from the CPU, and
      a determination circuit which is coupled to receive the internal power supply voltage and which determines whether a voltage value of the internal power supply voltage provided from the voltage regulator has been changed to a voltage value specified from the CPU,
   wherein the determination circuit is coupled to receive a first signal output from the CPU for requesting a change of the voltage value of the internal power supply voltage, and provides to the CPU a second signal for indicating that the voltage value of the internal power supply voltage provided from the voltage regulator has been changed to the voltage value specified from the CPU.

2. The semiconductor integrated circuit according to claim 1,
   wherein, when increasing both the voltage value of the internal power supply voltage and the frequency of the operational clock signal, the CPU specifies an increase of the frequency of the operational clock signal to the clock generation circuit after receiving the second signal output from the determination circuit responding to the change of the voltage value of the internal power supply voltage and the first signal.

3. The semiconductor integrated circuit according to claim 1,
   wherein, when decreasing both the voltage value of the internal power supply voltage and the frequency of the operational clock signal, the CPU specifies the change of the voltage value of the internal power supply voltage after decreasing the frequency of the operational clock signal.

4. The semiconductor integrated circuit according to claim 1,
  wherein the determination circuit comprises a mask circuit which disables a determination result until expiration of a specified period after a reception of the first signal.

5. The semiconductor integrated circuit according to claim 1,
  wherein the power supply circuit further comprises a voltage setting circuit which is coupled to receive a voltage setting signal from the CPU to generate a setting voltage and determination voltages, supplies the setting voltage to the voltage regulator, and supplies the determination voltage to the determination circuit,
  wherein the determination voltages include a first determination voltage and a second determination voltage each having a specified voltage tolerance, and
  wherein the determination circuit determines that the specified internal power supply voltage has been attained when the internal power supply voltage reaches a voltage between the first determination voltage and the second determination voltage.

6. The semiconductor integrated circuit according to claim 1,
  wherein the power supply circuit further comprises, a voltage setting circuit and an overdrive circuit,
  wherein the voltage setting circuit is coupled to receive a voltage setting signal from the CPU to generate a setting voltage and supplies the setting voltage to the overdrive circuit and the determination circuit,
  wherein the overdrive circuit can output the setting voltage or an overdrive setting voltage exceeding the setting voltage to the voltage regulator, and
  wherein the determination circuit inputs the first signal, then allows the overdrive circuit to output the overdrive setting voltage, determines that the specified internal power supply voltage based on the overdrive setting voltage has been attained when an output voltage generated in the voltage regulator satisfies the setting voltage, and then allows the overdrive circuit to output the setting voltage.

7. The semiconductor integrated circuit according to claim 6,
  wherein said first signal independently specifies a request to increase the internal power supply voltage and a request to decrease the internal power supply voltage,
  wherein, when the first signal indicates a request to increase the internal power supply voltage, an output voltage generated by the voltage regulator in response to the overdrive setting voltage has a higher level than that of an output voltage generated by the voltage regulator in response to the setting voltage, and
  wherein, when the first signal indicates a request to decrease the internal power supply voltage, the output voltage generated by the voltage regulator in response to the overdrive setting voltage has a lower level than that of the output voltage generated by the voltage regulator in response to the setting voltage.

8. A semiconductor integrated circuit comprising:
  a CPU;
  a clock generation circuit which supplies an operational clock signal to the CPU, a frequency of the operational clock signal being specified from the CPU; and
  a power supply circuit including:
    a voltage regulator which is coupled to receive an external power supply voltage and which provides an internal power supply voltage from the external power supply voltage, a voltage value of the internal power supply voltage being specified from the CPU, and
    a determination circuit which is coupled to receive the internal power supply voltage and which determines whether a voltage value of the internal power supply voltage provided from the voltage regulator has been changed to a voltage value specified from the CPU,
  wherein said voltage regulator can generate a voltage based on a setting voltage generated in response to a voltage setting signal supplied from said CPU or based on an overdrive setting voltage exceeding said setting voltage, and
  wherein the determination circuit is coupled to receive a first signal output from said CPU, then allows the voltage regulator to generate a voltage based on the overdrive setting voltage, determines that the specified internal power supply voltage has been attained when the internal power supply voltage satisfies the setting voltage, outputs a second signal to the CPU, and allows the voltage regulator to generate a voltage based on the setting voltage.

9. A power supply circuit comprising:
  a voltage regulator which is coupled to receive a first power supply voltage and which provides a second power supply voltage from the first power supply voltage; and
  a determination circuit which is coupled to receive the second power supply voltage and which determines whether a voltage value of the second power supply voltage provided from the voltage regulator has been changed to a voltage value specified from an outside source,
  wherein the determination circuit is coupled to receive a first signal output from the outside source for requesting a change of the voltage value of the second power supply voltage, and provides to the outside source a second signal for indicating that the voltage value of the second power supply voltage provided from the voltage regulator has been changed to the voltage value specified from the outside source.

10. The power supply circuit according to claim 9, wherein the determination circuit comprises a mask circuit which disables a determination result until expiration of a specified period after a reception of said first signal.

11. The semiconductor integrated circuit according to claim 9,
  wherein the power supply circuit further comprises a voltage setting circuit which is coupled to receive a voltage setting signal from the outside source to generate a setting voltage and determination voltages, supplies the setting voltage to said voltage regulator, and supplies said determination voltage to the determination circuit,
  wherein said determination voltages include a first determination voltage and a second determination voltage each having a specified voltage tolerance toward positive and negative sides with reference to the setting voltage, and
  wherein the determination circuit determines that the specified second power supply voltage has been attained when the second power supply voltage reaches a voltage between the first determination voltage and the second determination voltage.

12. The semiconductor integrated circuit according to claim 9,
wherein the power supply circuit further comprises a voltage setting circuit and an overdrive circuit,
wherein the voltage setting circuit is coupled to receive a voltage setting signal from the outside source to generate a setting voltage and supplies the setting voltage to the overdrive circuit and the determination circuit,
wherein the overdrive circuit can output the setting voltage or an overdrive setting voltage exceeding the setting voltage to the voltage regulator, and
wherein the determination circuit inputs the first signal, then allows the overdrive circuit to output the overdrive setting voltage, determines that the specified second power supply voltage based on the overdrive setting voltage has been attained when an output voltage generated in the voltage regulator satisfies the setting voltage, and then allows the overdrive circuit to output the setting voltage.

13. The semiconductor integrated circuit according to claim 9,
wherein the first signal independently specifies a request to increase the second power supply voltage and a request to decrease the second power supply voltage,
wherein, when the first signal indicates a request to increase the second power supply voltage, an output voltage generated by the voltage regulator in response to the overdrive setting voltage has a higher level than that of an output voltage generated by the voltage regulator in response to the setting voltage, and
wherein, when the first signal indicates a request to decrease the second power supply voltage, the output voltage generated by the voltage regulator in response to the overdrive setting voltage has a lower level than that of the output voltage generated by the voltage regulator in response to the setting voltage.

14. An information recording medium recording design data of a power supply circuit in a computer-readable manner,
wherein said design data specifies a voltage regulator which is coupled to receive a first power supply voltage and which provides a second power supply voltage from the first power supply voltage; and a determination circuit which is coupled to receive the second power supply voltage and which determines whether a voltage value of the second power supply voltage provided from the voltage regulator has been changed to a voltage value specified from an outside source, and
wherein the determination circuit is coupled to receive a first signal output from the outside source for requesting a change of the voltage value of the second power supply voltage, and provides to the outside source a second signal for indicating that the voltage value of the second power supply voltage provided from the voltage regulator has been changed to the voltage value specified from the outside source.

15. The information recording medium according to claim 14, wherein the determination circuit comprises a mask circuit which disables a determination result until expiration of a specified period after a reception of said first signal.

16. The information recording medium according to claim 14,
wherein the power supply circuit further comprises a voltage setting circuit which is coupled to receive a voltage setting signal from the outside source to generate a setting voltage and determination voltages, supplies the setting voltage to said voltage regulator, and supplies the determination voltages to the determination circuit,
wherein the determination voltages include a first determination voltage and a second determination voltage each having a specified voltage tolerance, and
wherein the determination circuit determines that the specified second power supply voltage has been attained when the second power supply voltage reaches a voltage between the first determination voltage and the second determination voltage.

17. The information recording medium according to claim 14,
wherein the power supply circuit further comprises a voltage setting circuit and an overdrive circuit,
wherein the voltage setting circuit is coupled to receive a voltage setting signal from the outside source to generate a setting voltage and supplies the setting voltage to the overdrive circuit and the determination circuit,
wherein the overdrive circuit can output the setting voltage or an overdrive setting voltage exceeding the setting voltage to said voltage regulator, and
wherein the determination circuit inputs the first signal, then allows the overdrive circuit to output the overdrive setting voltage, determines that the specified second power supply voltage based on the overdrive setting voltage has been attained when an output voltage generated in the voltage regulator satisfies the setting voltage, and then allows the overdrive circuit to output the setting voltage.

18. The information recording medium according to claim 17,
wherein the first signal independently specifies a request to increase the second power supply voltage and a request to decrease the second power supply voltage,
wherein, when the first signal indicates a request to increase the second power supply voltage, an output voltage generated by the voltage regulator in response to the overarive setting voltage has a higher level than that of an output voltage generated by the voltage regulator in response to the setting voltage, and
wherein, when the first signal indicates a request to decrease the second power supply voltage, the output voltage generated by the voltage regulator in response to the overdrive setting voltage has a lower level than that of the output voltage generated by the voltage regulator in response to the setting voltage.

19. A semiconductor integrated circuit comprising:
a CPU;
a clock generation circuit; and
a power supply circuit,
wherein the CPU outputs a frequency setting signal in connection with an operational clock signal frequency for the clock generation circuit, and a voltage setting signal in connection with an internal power supply voltage for the power supply circuit,
wherein the clock generation circuit supplies the operational clock signal to the CPU,
wherein the power supply circuit includes a voltage regulator to generate the internal power supply voltage from an external power supply voltage, and a determination circuit to determine a status of transition to a voltage specified by the voltage setting signal,
wherein the determination circuit receives a first signal output from the CPU, determines that the specified voltage has been attained, and outputs a second signal to the CPU, wherein the CPU, when increasing the internal power supply voltage and the operational clock signal frequency, outputs the first signal, outputs the voltage setting signal to increase the internal power supply voltage, correspondingly inputs the second signal output from the determination circuit, and then outputs the frequency setting signal to increase the operational clock signal frequency.

20. A semiconductor integrated circuit comprising:

a CPU;

a clock generation circuit; and a power supply circuit, wherein the CPU which outputs a frequency setting signal in connection with an operational clock signal frequency for the clock generation circuit, and a voltage setting signal in connection with an internal power supply voltage for the power supply circuit, wherein the clock generation circuit supplies the operational clock signal to the CPU, wherein the power supply circuit includes a voltage regulator to generate the internal power supply voltage from an external power supply voltage, and a determination circuit to determine a status of transition to a voltage specified by the voltage setting signal, wherein the determination circuit receives a first signal output from the CPU, determines that the specified voltage has been attained, and outputs a second signal to the CPU, wherein the CPU, when decreasing the internal power supply voltage and the operational clock signal frequency, outputs the frequency setting signal to decrease the operational clock signal frequency and then outputs the voltage setting signal to decrease the internal power supply voltage.

21. A semiconductor integrated circuit comprising:

a CPU;

a clock generation circuit which supplies an operational clock signal to the CPU, a frequency of the operation clock signal being specified from the CPU; and a power supply circuit including:

a voltage regulator which is coupled to receive an external power supply voltage and which provides an internal power supply voltage from the external power supply voltage, a voltage value of the internal power supply voltage being specified from the CPU, and a determination circuit which is coupled to receive the internal power supply voltage and which determines whether a voltage value of the internal power supply voltage provided from the voltage regulator has been changed to a voltage value specified from the CPU, wherein, when increasing both the voltage value of the internal power supply voltage and the frequency of the operational clock signal, the CPU specifies an increase of the frequency of the operational clock signal to the clock generation circuit after receiving a signal output from the determination circuit responding to the change of the voltage value of the internal power supply voltage to the voltage value specified from the CPU.

22. A semiconductor integrated circuit comprising:

a CPU;

a clock generation circuit which supplies an operation clock signal to the CPU, a frequency of the operational clock signal being specified from the CPU; and a power supply circuit including:

a voltage regulator which is coupled to receive an external power supply voltage and which provides an internal power supply voltage from the external power supply voltage, a voltage value of the internal power supply voltage being specified from the CPU, and a determination circuit which is coupled to receive the internal power supply voltage and which determines whether a voltage value of the internal power supply voltage provided from the voltage regulator has been changed to a voltage value specified from the CPU, and wherein, when decreasing both the voltage value of the internal power supply voltage and the frequency of the operational clock signal, the CPU specifies the change of the voltage value of the internal power supply voltage after decreasing the frequency of the operational clock signal.

* * * * *